(12) United States Patent
Xu et al.

(10) Patent No.: US 11,387,149 B2
(45) Date of Patent: Jul. 12, 2022

(54) SEMICONDUCTOR DEVICE AND METHOD FOR FORMING GATE STRUCTURE THEREOF

(71) Applicant: SHANGHAI INDUSTRIAL μTECHNOLOGY RESEARCH INSTITUTE, Shanghai (CN)

(72) Inventors: Qiuxia Xu, Shanghai (CN); Kai Chen, Shanghai (CN)

(*) Notice: Subject to any disclaimer, the term of this patent is extended or adjusted under 35 U.S.C. 154(b) by 224 days.

(21) Appl. No.: 16/883,933

(22) Filed: May 26, 2020

(65) Prior Publication Data

US 2021/0143068 A1  May 13, 2021

(51) Int. Cl.
| | | |
|---|---|---|
| H01L 21/8238 | (2006.01) | |
| H01L 21/28 | (2006.01) | |
| H01L 29/66 | (2006.01) | |
| H01L 29/49 | (2006.01) | |
| H01L 29/51 | (2006.01) | |

(52) U.S. Cl.
CPC ........ H01L 21/823857 (2013.01); H01L 21/28088 (2013.01); H01L 21/823842 (2013.01); H01L 29/4966 (2013.01); H01L 29/516 (2013.01); H01L 29/66545 (2013.01)

(58) Field of Classification Search
CPC ....... H01L 21/823857; H01L 21/28088; H01L 21/823842; H01L 29/4966; H01L 29/516; H01L 29/66545
See application file for complete search history.

(56) References Cited

U.S. PATENT DOCUMENTS

| | | | | |
|---|---|---|---|---|
| 10,505,040 B2* | 12/2019 | Ho | ............ | H01L 27/0924 |
| 2020/0098925 A1* | 3/2020 | Dewey | ............ | H01L 29/40111 |
| 2020/0105897 A1* | 4/2020 | Hsu | ............ | H01L 21/02189 |
| 2020/0127111 A1* | 4/2020 | Lin | ............ | H01L 21/76829 |
| 2021/0313440 A1* | 10/2021 | Peng | ............ | H01L 29/66795 |

* cited by examiner

*Primary Examiner* — Shahed Ahmed
*Assistant Examiner* — Vicki B. Booker
(74) *Attorney, Agent, or Firm* — Global IP Services; Tianhua Gu

(57) ABSTRACT

The present disclosure provides a semiconductor device and a method for forming a gate structure thereof. The method includes: preparing a semiconductor substrate, and forming an active region on the semiconductor substrate; forming a dummy gate stack, a gate sidewall spacer, N-type and/or P-type source/drain regions, and an interlayer dielectric layer on the active region sequentially; removing the dummy gate stack to form a gate opening, and forming an interface oxide layer and a ferroelectric gate dielectric layer sequentially at the gate opening; forming a stress sacrificial layer on the ferroelectric gate dielectric layer, and performing an annealing process; during the annealing process, the clamping effect of the stress sacrificial layer induces the ferroelectric gate dielectric layer converted to form a ferroelectric-phase gate dielectric layer; removing the stress sacrificial layer; and forming a metal gate on the ferroelectric-phase gate dielectric layer.

19 Claims, 22 Drawing Sheets

SEMICONDUCTOR DEVICE AND METHOD FOR FORMING GATE STRUCTURE THEREOF

CROSS REFERENCES TO RELATED APPLICATION

This application claims the benefit of priority to Chinese Patent Application No. CN 2019110954362, filed with CNIPO on Nov. 11, 2019, the contents of which are incorporated herein by reference in its entirety.

TECHNICAL FIELD

The present disclosure relates to the technical field of semiconductor technology, and in particular, to a semiconductor device and a method for forming a gate structure thereof.

BACKGROUND

As the feature size of CMOS devices continues to shrink and integration level continues to increase, the power consumption of integrated circuit chips also continues increasing. However, MOS transistors are based on a hot carrier diffusion conduction mechanism, and it cannot overcome a Boltzmann limitation. That is, MOS transistors cannot overcome the limitation of the subthreshold slope of the device, so that it cannot be lower than 60 mV/dec at room temperature.

Currently, ferroelectric material is used to replace high-K gate dielectric material in the field-effect transistors. The negative capacitance effect of ferroelectric materials can break through the Boltzmann limitation of the sub-threshold swing and realize an ultra-steep sub-threshold swing negative capacitance field-effect transistors (NCFETs) have a higher on/off current ratio, and providing a new way for ultra-high speed, low power consumption, high performance logic circuits and memory applications. In addition, the NCFETs are fully compatible with the traditional CMOS process in the industry, and the process is simple, the cost is low, and it is easy to apply to massive production.

However, in the current negative capacitance field-effect transistor, the gate metal with a dual-band-edge work function used to meet a threshold voltage required by the CMOS transistor affects the negative capacitance effect seriously. The ferroelectric gate dielectrics thinned for further scaling will sharply increase the gate leakage current density. The above contradictions restrict the development of negative capacitance field-effect transistor, and are urgently needed to be solved in this field.

Therefore, it is necessary to propose a new semiconductor device and a method for forming a gate structure to solve the above problems.

SUMMARY

In view of the above-mentioned shortcomings of the prior art, the object of the present disclosure provides a semiconductor device and a method for forming a gate structure thereof to solve the problems that is a gate metal with a dual-band-edge work function used in an negative capacitance field-effect transistor affecting a negative capacitance effect, and the thin ferroelectric gate dielectric causes a higher gate leakage current density.

The present disclosure provides a method for forming a gate structure of a semiconductor device, including: preparing a semiconductor substrate, and forming an active region on the semiconductor substrate, the active region includes a NMOSFET region and/or a PMOSFET region; forming a dummy gate stack, a gate sidewall spacer, N-type and/or P-type source/drain regions, and an interlayer dielectric layer on the active region sequentially; removing the dummy gate stack to form a gate opening, and forming an interface oxide layer and a ferroelectric gate dielectric layer sequentially at the gate opening; forming a stress sacrificial layer on the ferroelectric gate dielectric layer, and performing an annealing process; during the annealing process, the clamping effect of the stress sacrificial layer induces the ferroelectric gate dielectric layer converted to form a ferroelectric phase-gate dielectric layer; removing the stress sacrificial layer; and forming a metal gate layer on the ferroelectric-phase gate dielectric layer.

Optionally, before forming the ferroelectric gate dielectric layer, the method further includes forming a high-K seed layer on the interface oxide layer, the high-K seed layer is used to increase the strength of the ferroelectric phase of the ferroelectric-phase gate dielectric layer formed in the annealing process and to reduce gate leakage current density.

Preferably, the high-K seed layer is one or more of $ZrO_2$ or $TiO_2$; and a thickness of the high-K seed layer ranges from 0.5 nm to 2.5 nm.

Preferably, the interfacial oxide layer is one or more of $SiO_2$, SiON, $HfO_2$, $Al_2O_3$, HfSiO, HfSiON, HfAlON, $Y_2O_3$, $La_2O_3$, or HfLaON, and a thickness of the interfacial oxide layer ranges from 0.5 nm to 1.5 nm.

Optionally, before forming the stress sacrificial layer on the ferroelectric gate dielectric layer, the method further includes: forming an etching barrier metal layer on the ferroelectric gate dielectric layer, and when removing the stress sacrificial layer, an etching process is used to remove the stress sacrificial layer, and etching is stopped on the etching barrier metal layer.

Optionally, the etching barrier metal layer is one or more of TaN, Ta, MoN, or WN, and the thickness of the etching barrier metal layer ranges from 1.0 nm to 2.0 nm.

Optionally, the etching process comprises dry etching and wet etching.

Optionally, the stress sacrificial layer includes a TiN layer, and the thickness of the stress sacrificial layer ranges from 3 nm to 10 nm.

Optionally, the annealing process includes a rapid thermal annealing process, the annealing temperature ranges from 350° C. and 850° C., and the annealing time ranges from 20 seconds to 40 seconds.

Optionally, the ferroelectric gate dielectric layer is one or more of HfZrO, HfZrAlO, HfAlO, HfSiO, HfLaO, HfSrO, HfGdO, or HfYO, and the thickness of the ferroelectric gate dielectric layer ranges from 1.2 nm to 10 nm.

Optionally, the percentage content of doping element Zr in the HfZrO and the HfZrAlO ranges from 30% to and 60%, the percentage content of doping element Si in the HfSiO ranges from 3% to 6%, the percentage content of doping element Y in the HfYO ranges from 4% to 6.5%, the percentage content of doping element Al in the HfZrAlO and the HfAlO ranges from 3.5% to 6.5%, the percentage content of doping element Gd in the HfGdO ranges from 1.5% to 5%, the percentage content of doping element Sr in the HfSrO ranges from 8% to 12%, and the percentage content of doping element La in the HfLaO ranges from 3% to 6%.

Optionally, the metal gate includes a first metal gate and a second metal gate sequentially formed on the ferroelectric-phase gate dielectric layer, and the thickness of the first metal gate can be between 1 nm and 10 nm.

Optionally, after forming the first metal gate, the method further includes doping a P-type dopant in the first metal gate within PMOSFET region and/or doping an N-type dopant in the first metal gate within NMOSFET region to respectively adjust a gate work function required by a PMOSFET and/or an NMOSFET.

Optionally, the first metal gate comprises a dual metal gate with a P-type work function metal gate and/or an N-type work function metal gate, which can be formed through a dual metal gate work function process.

Optionally, the second metal gate includes an oxygen-absorbing metal layer, a barrier layer, and a filling metal layer formed sequentially; the oxygen-absorbing metal layer can be one or more of Ti, TiAl, or Ta; the barrier layer can be one or more of TiN, TaN, Ta, MoN, AlN, or WN; and the filling metal layer can be one or more of W, Al, TiAl, TiAlC, or Mo.

Optionally, after forming the metal gate, the method further comprises the steps of forming a contact interconnection structure and performing alloy annealing process.

Optionally, the alloy annealing process is performed in an inert atmosphere or a weakly reducing atmosphere, and the annealing temperature ranges from 350° C. to 450° C.

The present disclosure further provides a method for forming a semiconductor device. The structure of the semiconductor device is formed by using the method for forming a structure of a semiconductor device provided in the present disclosure.

Optionally, the semiconductor device is a planar gate semiconductor device, a fin gate semiconductor device, or a gate-all-around semiconductor device.

As described above, the present disclosure provides a semiconductor device and a method for forming a gate structure thereof, and has the following beneficial effects: the present disclosure provides a new semiconductor device and a method for forming a gate structure thereof. In order to form a gate dielectric layer with a strong ferroelectric phase, a stress sacrificial layer is pre-deposited on the ferroelectric gate dielectric layer, and an annealing process is performed, during the annealing process, the clamping effect of the stress sacrificial layer induces the ferroelectric gate dielectric layer converted to form a ferroelectric-phase gate dielectric layer; and after removing the stress sacrificial layer, then a metal gate with band-edge work function is formed. While the present disclosure introducing the negative capacitance effect, it also obtains the band-edge work function required by the MOS device, and prevents the problem of higher gate leakage current density of the ultra-thin ferroelectric gate dielectric layer.

DESCRIPTION OF REFERENCE NUMERALS

Figure 1:
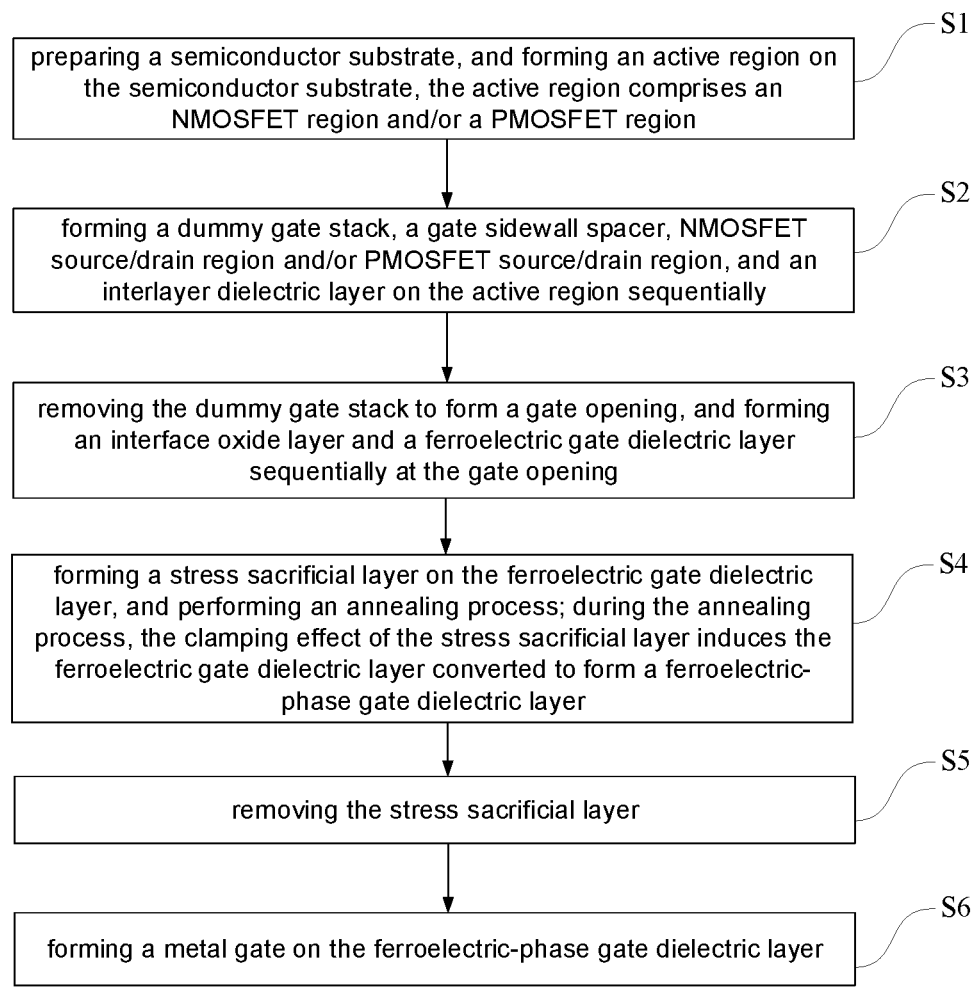
FIG. 1 is a flowchart of a method for forming a gate structure of a semiconductor device according to Embodiment 1 of the present disclosure.

100 Semiconductor Substrate
101 Interface oxide layer
102 Ferroelectric gate dielectric layer
102a Ferroelectric-phase gate dielectric layer
103 High-K seed layer
104 Etching barrier metal layer
105 Stress sacrificial layer
106 First metal gate
107 Second metal gate
200 Semiconductor substrate
201 Narrow trench isolation
202 Dummy gate oxide layer
203 Dummy gate amorphous silicon layer
204 Sidewall spacer
205 Source and drain region
206 Metal silicide
207 Interlayer dielectric layer
208 Interface oxide layer
209 First metal gate
210 Stress sacrificial layer
211 Ferroelectric gate dielectric layer
212 Second metal gate
300 Semiconductor substrate
301 Fin structure
302 Isolation structure
302a Isolation material layer
303 Dummy gate oxide layer
304 Dummy gate amorphous silicon layer
305 Sidewall spacer
306 Hard mask
307 Interlayer dielectric layer
307a Interlayer barrier layer
308 Source and drain region
309 Interface oxide layer
310 Ferroelectric gate dielectric layer
311 First metal gate
312 Second metal gate
400 Semiconductor substrate
401 Narrow trench isolation
402 Mask oxide layer
403 Hard mask
404 Stacked nanowire structure
405 Sacrificial oxide layer
406 First array of nanowire
407 Dummy gate oxide layer
408 Dummy gate amorphous silicon layer
409 Source region
410 Drain region
411 Sidewall spacer
412 Ferroelectric gate dielectric layer
413 First metal gate
414 Second metal gate
415 Interlayer dielectric layer
416 Second array of nanowire
S1~S6 Step 1) to 6)

DETAILED DESCRIPTION OF THE PREFERRED EMBODIMENTS

The following describes the embodiments of the present disclosure through specific examples. A person skilled in the art can easily understand other advantages and effects of the present disclosure from the content disclosed in this specification. The present disclosure may also be implemented or applied through different specific embodiments. Various details in this specification may also be modified or changed based on different viewpoints and applications without departing from the spirit of the present disclosure.

Figure 66:
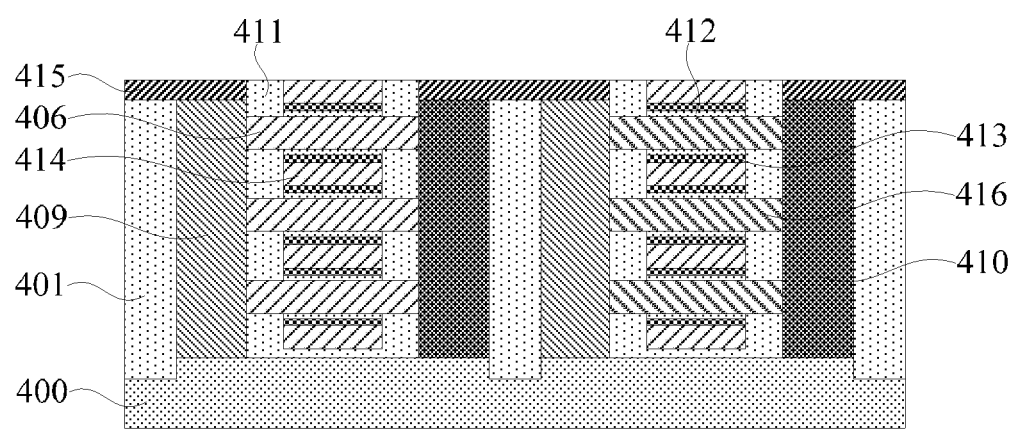
FIG. 66 is a schematic cross-sectional view along a BB direction shown in FIG. 64.

Referring to FIGS. 1 to 66. It should be noted that the drawings provided in the following embodiments only exemplify the basic idea of the present disclosure. Therefore, only the components related to the present disclosure are shown in the drawings, and are not drawn according to the quantity, shape, and size of the components during actual implementation. During actual implementation, the type, quantity, and proportion of the components may be changed, and the layout of the components may be more complicated.

In a conventional CMOSFET, MOSFET is based on the hot carrier diffusion conduction mechanism, therefore, it unable to overcome the Boltzmann limitation. That is, the sub-threshold slope (SS) of the device cannot be lower than 60 mV/dec at room temperature. Limited by the sub-threshold swing, if the threshold voltage ($V_T$) is continuously decreasing, the off-state leakage ($I_{OFF}$) will increase exponentially, thereby causing the power consumption of the device to rise greatly. Therefore, the Boltzmann theory limits the operating voltage of the device cannot be further reduced as the device feature size scaling. Integrated circuits are facing unprecedented challenges. In order to break through the above limitation, it is urgent to study new devices with ultra-steep sub-threshold swing. If new mechanism s and measures cannot be developed to further reduce the sub-threshold swing of the device, the integrated circuits will not be able to continue to follow Moore's Law, and more importantly, the power consumption of integrated circuits cannot be further reduced.

The calculation formula of sub-threshold swing is:

$$SS = dV_G/d(\log I_{SD}) = (dV_G/d\psi_S) \cdot d\psi_S/d(\log I_{SD}) = (1 + C_S/C_{ins})(kT/q)\ln 10$$

$V_G$ is the gate voltage, $I_{SD}$ is the source-drain current, $\psi_S$ is the semiconductor channel surface potential, $C_S$ is the channel semiconductor capacitance, $C_{ins}$ is the gate dielectric capacitance, k is the Boltzmann constant, T is the temperature, and q is the electronic charge. It can be learned from this formula that the term $(kT/q)\ln 10$ is approximately 60 mV/dec at room temperature. Therefore, if SS is required to be less than 60 mV/dec, the key lies in the term $(1+C_S/C_{ins})$. In conventional field-effect transistor, $C_S$ and $C_{ins}$ both are positive values, resulting in term $(1+C_S/C_{ins})$ never being less than 1, and then SS can never be less than 60 mV/dec. The negative capacitance effect of ferroelectric materials makes the ferroelectric capacitance negative, that is, $C_F<0$. Therefore, by replacing the conventional gate dielectric material with the ferroelectric material, that is, by replacing $C_{ins}$ with $C_F$, can achieve $(1+C_S/C_F)$ less than 1, and finally make SS less than 60 mV/dec at room temperature.

It can be seen that by replacing the gate dielectric material in the field effect transistor with the ferroelectric material, the surface potential of the semiconductor channel in the device can be effectively increased to be greater than the externally applied gate voltage, thereby achieving a voltage amplification effect. This voltage amplification effect utilizes the negative capacitance effect of the ferroelectric material. Thus, the Boltzmann limit of the sub-threshold swing is broken, and the ultra-steep sub-threshold swing is achieved. The negative capacitance filed effect transistor (NCFET) has a higher on/off current ratio, and providing a new way for ultra-high speed, low power consumption, high performance logic circuits and memory applications. Moreover, the ferroelectric material negative capacitance CMOSFET is fully compatible with the conventional industry CMOS process, and the process is simple, the cost is low, and it is easy to be applied to mass production. However, in the current negative capacitance field-effect transistor, the gate metal with a dual-band-edge work function used to meet the threshold voltage required by the CMOSFET will seriously affect the negative capacitance effect. Moreover, the ferroelectric gate dielectric thinned for further scaling requirement will increase the gate leakage current drastically. The contradictions mentioned above restrict the development of negative capacitance field-effect transistor severely, and are urgently needed to be solved in this field.

Therefore, it is necessary to propose a new semiconductor device and a method for forming a gate structure to solve the above problems. Based on this, the present disclosure provides a new method for forming a gate structure, so as to introduce the negative capacitance effect, and also obtain the band-edge work function required for CMOSFET, and prevent the gate leakage current density of the ultra-thin ferroelectric gate dielectric layer from being high. The method for forming the gate structure can also be applied to the manufacturing of a planar gate semiconductor device, a fin gate semiconductor device, or a gate-all-around semiconductor device.

Embodiment 1

Referring to FIGS. 1 to 7, this embodiment provides a method for forming a gate structure of a semiconductor device, including:

1) preparing a semiconductor substrate, and forming an active region on the semiconductor substrate. The active region includes an NMOSFET region and/or a PMOSFET region;

2) forming a dummy gate stack, a gate sidewall spacer, N-type source/drain region and/or P-type source/drain region, and an interlayer dielectric layer on the active region sequentially.

3) removing the dummy gate stack to form a gate opening, and sequentially forming an interface oxide layer and a ferroelectric gate dielectric layer at the gate opening.

4) forming a stress sacrificial layer on the ferroelectric gate dielectric layer, and performing an annealing process. During the annealing process, the clamping effect of the stress sacrificial layer induces the ferroelectric gate dielectric layer converted to form a ferroelectric-phase gate dielectric layer;

5) removing the stress sacrificial layer; and 6) forming a metal gate on the ferroelectric-phase gate dielectric layer.

Figure 2:
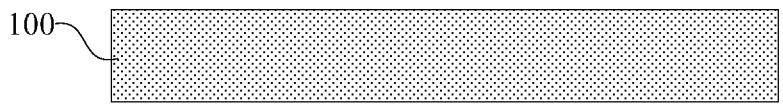
FIG. 2 is a schematic cross-sectional view of a semiconductor substrate provided in a method for forming a gate structure of a semiconductor device provided in Embodiment 1 of the present disclosure.

In step 1), referring to step S1 in FIG. 1 and FIG. 2, a semiconductor substrate 100 is provided on which an active region including a NMOSFET region and/or a PMOSFET region is formed.

As shown in FIG. 2, the semiconductor substrate 100 may be a silicon substrate, a germanium substrate, a silicon germanium substrate, or a substrate made of other semiconductor materials. A planar structure may be formed on the semiconductor substrate 100, or a fin structure or a nanowire structure may be formed according to device structure requirements. The active region including an NMOSFET region and/or a PMOSFET region is also formed on the semiconductor substrate 100. For NMOSFET or PMOSFET device, an NMOSFET region or a PMOSFET region is formed; for CMOSFET device, both NMOSFET region and PMOSFET region are formed. Of course, the present disclosure is not limited to the above-mentioned semiconductor device, and the configuration of the active region can also be flexibly adjusted according to the type of the semiconductor device formed.

In step 2), referring to step S2 in FIG. 1, a dummy gate stack, a gate sidewall spacer, NMOSFET source/drain region and/or PMOSFET source/drain region, and an interlayer dielectric layer are formed on the active region sequentially. It should be noted that the structure and forming process of the dummy gate stack, the gate sidewall spacer, the NMOSFET source/drain region and/or PMOSFET source/drain region, and the interlayer dielectric layer are not described in detail in this embodiment. For specific processes, please refer to the relevant parts in Embodiments 2 to 4. Among them, the N type or P type of the source/drain regions can be selected according to the type of the semiconductor device formed.

Figure 3:
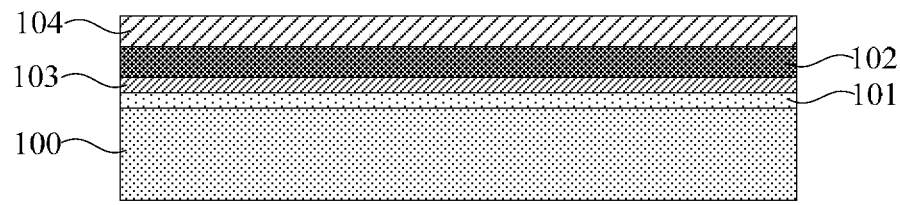
FIG. 3 is a schematic cross-sectional view after an interface oxide layer, a HK seed layer, a ferroelectric gate dielectric layer and an etching barrier metal layer are formed in a method for forming a gate structure of a semiconductor device according to Embodiment 1 of the present disclosure.

In step 3), referring to step S3 in FIG. 1 and FIGS. 2 to 3, the dummy gate stack is removed to form a gate opening, and an interfacial oxide layer 101 and a ferroelectric gate dielectric layer 102 are formed sequentially at the gate opening.

It should be pointed out that FIG. 2 and FIG. 3 are schematic diagrams of the gate opening. That is, FIG. 2 and FIG. 3 are schematic diagrams of a partial region of the exposed semiconductor substrate after the dummy gate stack is removed. The gate sidewall spacer, NMOSFET source/drain region and/or PMOSFET source/drain region, or the interlayer dielectric layer in peripheral are not shown in FIG. 2 and FIG. 3. For such specific structures, please refer to the relevant parts of Embodiments 2 to 4.

As an example, as shown in FIG. 3, an interfacial oxide layer 101 is formed on the semiconductor substrate 100. Optionally, the interface oxide layer 101 can be one or more of $S_iO_2$, SiON, $HfO_2$, $Al_2O_3$, HfSiO, HfSiON, HfAlON, $Y_2O_3$, $La_2O_3$, or HfLaON. The thickness range of the interface oxide layer 101 ranges from 0.5 nm to 1.5 nm.

As an example, as shown in FIG. 3, the ferroelectric gate dielectric layer 102 can be one or more of HfZrO, HfZrAlO, HfAlO, HfSiO, HfLaO, HfSrO, HfGdO, or HfYO. The thickness of ferroelectric gate dielectric layer 102 ranges from 1.2 nm to 10 nm.

Optionally, the percentage content of doping element Zr in the HfZrO and the HfZrAlO ranges from 30% to 60%, the percentage content of doping element Si in the HfSiO ranges from 3% to 6%, the percentage content of doping element Y in the HfYO ranges from 4% to 6.5%, the percentage content of doping element Al in the HfZrAlO and the HfAlO ranges from 3.5% to 6.5%, the percent content of doping element Gd in the HfGdO ranges from 1.5% to 5%, the percentage content of doping element Sr in the HfSrO ranges from 8% to 12%, and the percentage content of doping element La in the HfLaO ranges from 3% to 6%.

As an example, as shown in FIG. 3, before forming the ferroelectric gate dielectric layer 102 on the interface oxide layer 101, the method further includes forming a high-K seed layer 103 on the interface oxide layer. Optionally, the high-K seed layer 103 can be one or more of $ZrO_2$ or $TiO_2$, which can be obtained by atomic layer deposition (ALD). The thickness of the high-K seed layer ranges from 0.5 nm to 2.5 nm. In this embodiment, the high-K seed layer 103 is HK $ZrO_2$ grown by ALD.

In this embodiment, the high-K seed layer 103 is introduced between the interface oxide layer 101 and the ferroelectric gate dielectric layer 102. On the one hand, due to the high dielectric constant of the high-K seed layer 103, it will not increase the equivalent oxide thickness (EOT) significantly. But because of the increasing of its physical thickness, the leakage current density reduced greatly. On the other hand, because the ALD HK $ZrO_2$ film is polycrystalline structure, it is mainly C phase, t phase, and O phase. Experiments show that when the ALD HfZrO ferroelectric film is further deposited on this $ZrO_2$ film, this ZrO2 film acts as a seed layer, the induction of the ZrO2 seed layer contributes to the formation of the HfZrO ferroelectric phase, which enhances the strength of the negative capacitance effect. The high-K seed layer 103 is used to increases the strength of the ferroelectric phase of the ferroelectric-phase gate dielectric layer formed during the annealing process, and reduces a gate leakage current density greatly.

In an exemplary example, as shown in FIG. 3, optionally, an etching barrier metal layer 104 is formed on the ferroelectric gate dielectric layer 102. For example, the etching barrier metal layer 104 can be one or more of TaN, Ta, MoN, or WN. The thickness of the etching barrier metal layer 104 ranges from 1.0 nm to 2.0 nm.

Figure 4:
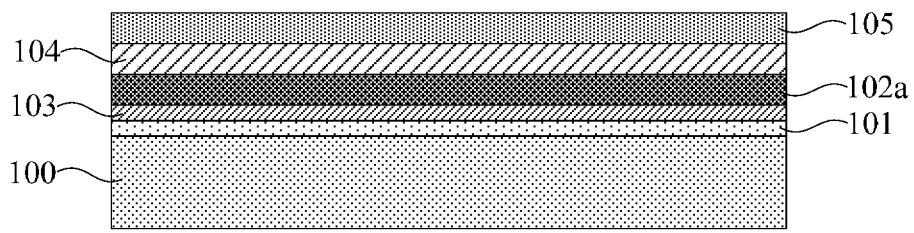
FIG. 4 is a schematic cross-sectional view after a stress sacrificial layer 105 is formed and an annealing process is performed in a method for forming a gate structure of a semiconductor device according to Embodiment 1 of the present disclosure.

In step 4), referring to step S4 in FIG. 1 and FIG. 4, a stress sacrificial layer 105 is formed on the ferroelectric gate dielectric layer 102, and an annealing process is performed. During the annealing process, the clamping effect of the stress sacrificial layer 105 induces the ferroelectric gate dielectric layer 102 converted to form a ferroelectric-phase gate dielectric layer 102a.

As an example, as shown in FIG. 4, the stress sacrificial layer 105 has high stress. In this embodiment, the stress sacrificial layer 105 includes a TiN layer. The thickness of the stress sacrificial layer 105 ranges from 3 nm to 10 nm. Optionally, the annealing process includes rapid thermal annealing (RTA). The annealing temperature ranges from 350° C. to 850° C., and the annealing time range from 20 seconds to 40 seconds. The annealing process can be rapid thermal annealing (RTA), spike annealing, or laser annealing. The specific annealing process may be determined according to the thermal performance of the ferroelectric material. In this embodiment, the rapid thermal annealing (RTA) process is applied.

Figure 5:
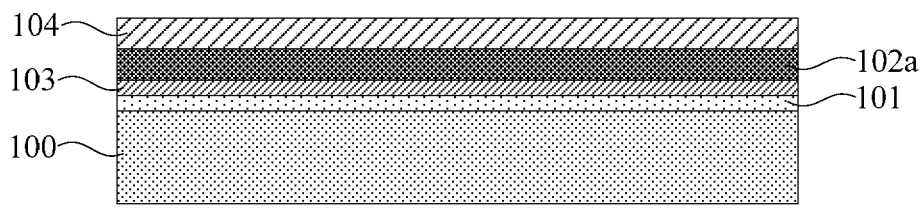
FIG. 5 is a schematic cross-sectional view after a stress sacrificial layer is removed in a method for forming a gate structure of a semiconductor device according to Embodiment 1 of the present disclosure.

In step 5), referring to step S5 in FIG. 1 and FIG. 4 to FIG. 5, the stress sacrificial layer 105 is removed.

As an example, as shown in FIG. 4 and FIG. 5, when removing the stress sacrificial layer 105, an etching process is used to remove the stress sacrificial layer 105, and the etching process is stopped on the etching barrier metal layer 104. The etching process includes dry etching and wet etching. When removing the stress sacrificial layer 105 through wet etching, the etching barrier metal layer 104 functions as an etching stop layer protecting the underlying ferroelectric-phase gate dielectric layer 102a from being damaged by the etching.

Figure 6:
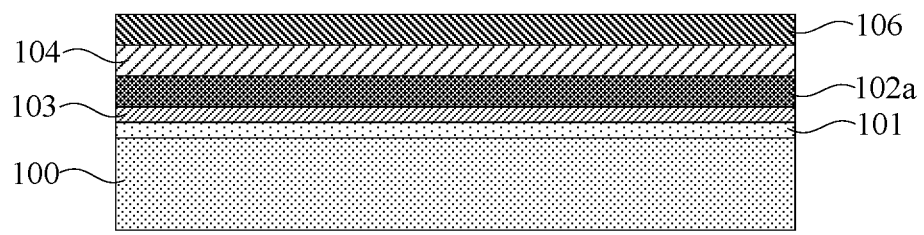
FIG. 6 is a schematic view cross-sectional view after a first metal gate 106 is formed in a method for forming a gate structure of a semiconductor device according to Embodiment 1 of the present disclosure.
Figure 7:
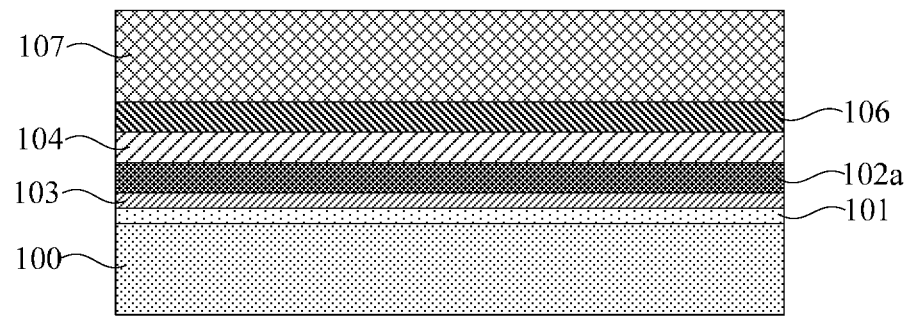
FIG. 7 is a schematic cross-sectional view after a second metal gate 107 is formed in a method for forming a gate structure of a semiconductor device according to Embodiment 1 of the present disclosure.

In step 6), referring to step S6 in FIG. 1 and FIGS. 6 to 7, a metal gate is formed on the ferroelectric-phase gate dielectric layer 102a.

As an example, as shown in FIG. 6 and FIG. 7, the metal gate includes a first metal gate 106 and a second metal gate 107. The first metal gate 106 and the second metal gate 107 are sequentially formed on the ferroelectric-phase gate dielectric layer 102a. The thickness of the first metal gate 106 ranges from 1 nm to 10 nm. Optionally, the first metal gate may be one or more of Ti, Al, Ta, Hf, Ru, Mo, W, TiN, TiC, TiAl, TiAlC, TiSiN, TaC, TaN, TaAlC, TaAl, TaCN, NbAlC, MoN, ZrN, WN, and TiWN.

As an example, after forming the first metal gate 106, the method further includes implanting P-type dopant and/or N-type dopant in the first metal gate 106, so as to respectively adjust the gate work function required by the PMOSFET and/or NMOSFET. By doping the first metal gate 106 with different types of dopants, that is, by implanting P-type dopant (for a PMOSFET device) or N-type dopant (for an NMOSFET device) into only the first metal gate 106, not into the barrier metal layer and/or the ferroelectric gate dielectric layer, a P-type and/or N-type work function metal layer can be obtained respectively.

Optionally, the N-type dopant includes hydrides or fluorides of phosphorus and arsenic, and specifically, may be one or more of phosphane, arsinic, phosphorus pentafluoride, phosphorus trifluoride, arsenic pentafluoride, or arsenic trifluoride. The P-type dopant includes hydride, fluoride or chloride of boron, and specifically may be one or more of $B_2H_6$, $B_4H_{10}$, $B_6H_{10}$, $B_{10}H_{14}$, $B_{18}H_{22}$, $BF_3$, and $BCl_3$.

As an example, the first metal gate 106 includes a metal gate with a P-type work function or/and a metal gate with N-type work function, formed by a dual metal gate work function process. That is, the metal gate materials having with different work functions are deposited directly, instead of adjusting the work functions separately by doping after the first metal layer is formed.

Optionally, metals with the N-type work function can be used to reduce the work function of the semiconductor device, which can be one or more of Al, Ta, Ti, Zr, Nb, Hf, TiAl, TiAlC, TaN, TaC, TaAlC, or TaAl. Metals with the P-type work function can be used to increase the work function of the semiconductor device, which can be one or more of Pt, Ni, Ir, Re, Mo, Co, TiN, TiNC, MoN, or WN.

As an example, the second metal gate 107 includes an oxygen-absorbing metal layer, a barrier layer, and a filler metal layer which are formed sequentially on the first metal gate 106. The oxygen-absorbing metal layer can be one or more of Ti, TiAl, and Ta. The barrier layer can be one or more of TiN, TaN, Ta, MoN, AlN, and WN. The filler metal layer can be one or more of W, Al, TiAl, TiAlC, and Mo.

As an example, after forming the metal gate, the method further includes the steps of forming a contact interconnection structure, and performing alloy annealing process. Optionally, the alloy annealing process is performed in an inert atmosphere or a weakly reducing atmosphere. The annealing temperature r ranges from 350° C. to 450° C. In this embodiment, after the device structure and contact interconnection and other device structures are completed, the entire semiconductor structure may be annealed in an inert atmosphere (such as N2) or a weakly reducing atmosphere (such as a mixed atmosphere of N2 and H2), This annealing process drives the implanted dopant ions to diffuse and accumulate at the upper and lower interface of the gate dielectric layer, forming an electric dipole through interface reaction, and further adjusting the effective work function of the metal gate to meet the requirements of the semiconductor devices such as NMOSFET, PMOSFET or CMOSFET.

This embodiment provides a method for forming a gate structure of a device. In order to eliminate the influence caused by the deposited work function metal on the formation of the ferroelectric-phase gate dielectric layer, a stress sacrificial layer of TiN or other materials is deposited on the ferroelectric gate dielectric layer, and an annealing process is performed to induce the formation of ferroelectric phase in the ferroelectric dielectric layer, and then a work function metal gate is deposited. Due to the clamping effect of the TiN stress sacrificial film during the annealing process, which induces the ferroelectric gate dielectric layer converted to form a ferroelectric-phase gate dielectric layer; and the generation of the negative capacitance effect. The induction effect of introducing the high-K seed layer of $ZrO_2$ and other materials further enhances the strength of the ferroelectric phase. Through the above-mentioned process of forming the gate structure of the device, it can be seen that the negative capacitance field-effect transistor not only introducing the negative capacitance effect, but also obtains the band-edge work function required for the MOS device, and prevents the gate leakage current density of an ultra-thin ferroelectric gate dielectric layer from being high.

Embodiment 2

Referring to FIGS. 8 to 17, this embodiment provides a method for forming a planar gate semiconductor device, including the following steps.

Figure 8:
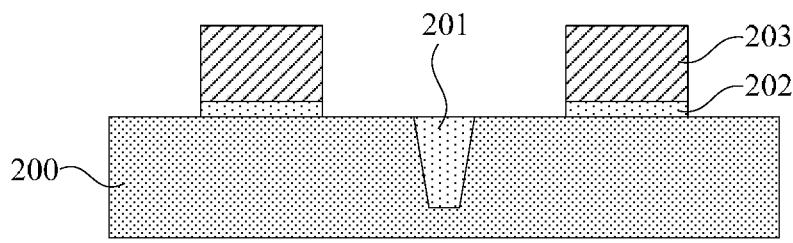
FIG. 8 is a schematic cross-sectional view after a narrow trench isolation 201 and a dummy gate stack are formed on a semiconductor substrate in a method for forming a planar gate semiconductor device according to Embodiment 2 of the present disclosure.

In step 1), referring to FIG. 8, a semiconductor substrate 200 is prepared. The semiconductor substrate 200 may be an SOI substrate. A shallow trench isolation (STI) 201 and a dummy gate stack are formed on the semiconductor substrate 200. The dummy gate stack includes a dummy gate oxide layer 202 and a dummy gate amorphous silicon layer 203. The shallow trench isolation 201 divides the region on the semiconductor substrate 200 into an NMOSFET region and a PMOSFET region.

Figure 9:
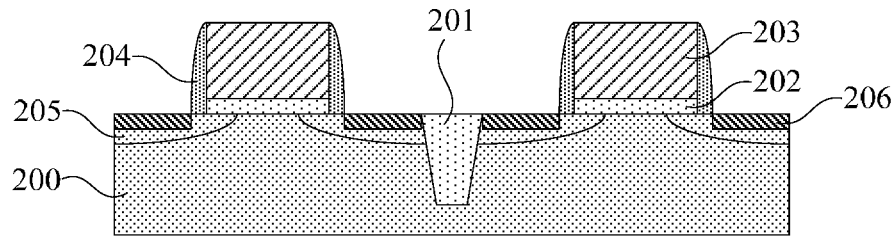
FIG. 9 is a schematic cross-sectional view after a sidewall spacer 204, a source and drain region 205, and a metal silicide 206 are formed in a method for forming a planar gate semiconductor device according to Embodiment 2 of the present disclosure.

In step 2), referring to FIG. 9, a sidewall spacer 204 is formed on a side wall of the dummy gate oxide layer 202 and the dummy gate amorphous silicon layer 203. The sidewall spacer 204 and the dummy gate stack are used as a mask, the PMOSFET source/drain region 205 within PMOSFET region and NMOSFET source/drain region 205 within NMOSFET region are formed on other region of the semiconductor substrate 200 by implanting P-type dopant and N-type dopant respectively. A metal silicide 206 is further formed on the source/drain regions 205.

Figure 10:
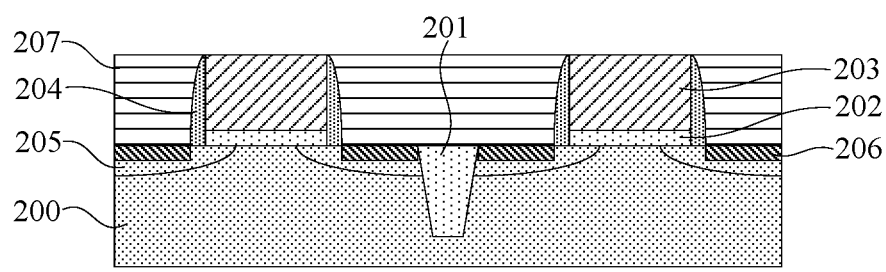
FIG. 10 is a schematic cross-sectional view after an interlayer dielectric layer 207 is formed and chemical mechanical polishing (CMP) is performed in a method for forming a planar gate semiconductor device according to Embodiment 2 of the present disclosure.

In step 3), referring to FIG. 10, an interlayer dielectric layer 207 is deposited by chemical vapor deposition (CVD). The interlayer dielectric layer 207 covers the semiconductor substrate 200 and the dummy gate stack. The interlayer dielectric layer 207 includes an oxide and a silicon nitride. After the deposition is completed, the top of the dummy gate amorphous silicon layer 203 is exposed by chemical mechanical polishing (CMP).

Figure 11:
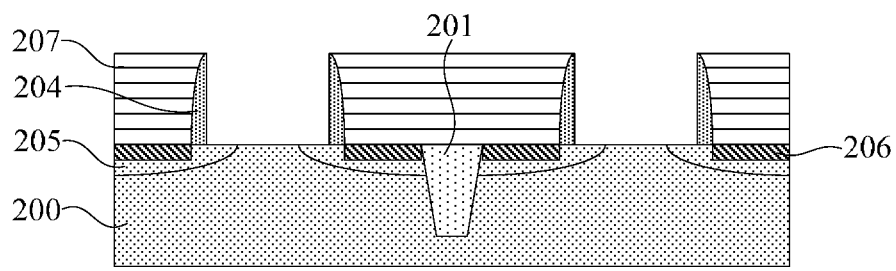
FIG. 11 is a schematic cross-sectional view after a dummy gate is removed in a method for forming a planar gate semiconductor device according to Embodiment 2 of the present disclosure.
Figure 12:
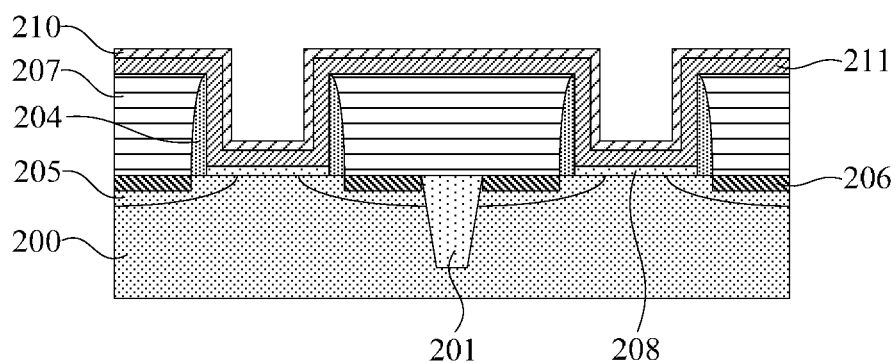
FIG. 12 is a schematic cross-sectional view after an interface oxide layer 208 and a ferroelectric gate dielectric layer 211 and a stress sacrificial layer 210 are formed and an annealing process is performed in a method for forming a planar gate semiconductor device according to Embodiment 2 of the present disclosure.

In step 4), referring to FIG. 11, the dummy gate stack is removed to form gate opening and to expose the semiconductor substrate 200. The method for removing the dummy gate stack includes dry etching or wet etching. Specifically, the amorphous silicon material may be etched by dry etching using F-based and Cl-based gases, or $HBr/Cl_2$-based gases; or by wet etching using TEMA. The oxide layer such as $SiO_2$ may be etched by dry etching using F-based gases, or by wet etching using an HF solution. It should be noted that the semiconductor device provided in this embodiment is a planar gate structure, and the substrate includes a planar semiconductor substrate. After removing the dummy gate stack, the gate opening is formed in the exposed area, and subsequent layers of structure are continuously formed on the semiconductor substrate in the gate opening.

Figure 13:
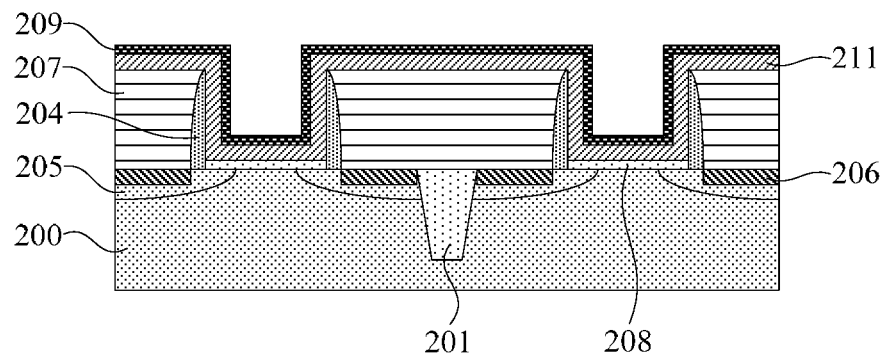
FIG. 13 is a schematic cross-sectional view after a stress sacrificial layer is removed and a first metal gate 209 is formed in a method for forming a planar gate semiconductor device according to Embodiment 2 of the present disclosure.

In step 5), referring to FIGS. 12 to 15, according to the gate structure forming method according to Embodiment 1, an interface oxide layer 208, a high-K seed layer, a ferroelectric gate dielectric layer, an etching barrier metal layer, and a first metal gate 209 are formed on the semiconductor substrate in sequentially. According to the method for forming the gate structure in the Embodiment 1, in the planar gate semiconductor device in this embodiment, a dummy gate stack is formed on the planar semiconductor substrate 200. After the dummy gate stack is removed, the gate structure described in Embodiment 1 is formed at the formed gate opening on substrate 200. Specifically, in FIG. 12, in the trench formed after the dummy gate stack is removed, the interface oxide layer 208 is first formed, and then a high-K seed layer, a ferroelectric gate dielectric layer, an etching barrier metal layer, and a stress sacrificial layer 210 are formed sequentially. The ferroelectric gate dielectric layer is converted into the ferroelectric-phase gate dielectric layer through an annealing process. For details, see step 2) to 4) in Embodiment 1, and the details are not repeated here. For ease of identification, in FIG. 12, the high-K seed layer, the ferroelectric gate dielectric layer/ferroelectric-phase gate dielectric layer, and the etching barrier metal layer are collectively labeled as a ferroelectric gate dielectric layer 211. In FIG. 13, after the annealing process, the stress sacrificial layer 210 is removed. For details, refer to steps 4) to 5) in Embodiment 1, and the details are not repeated here.

Figure 14:
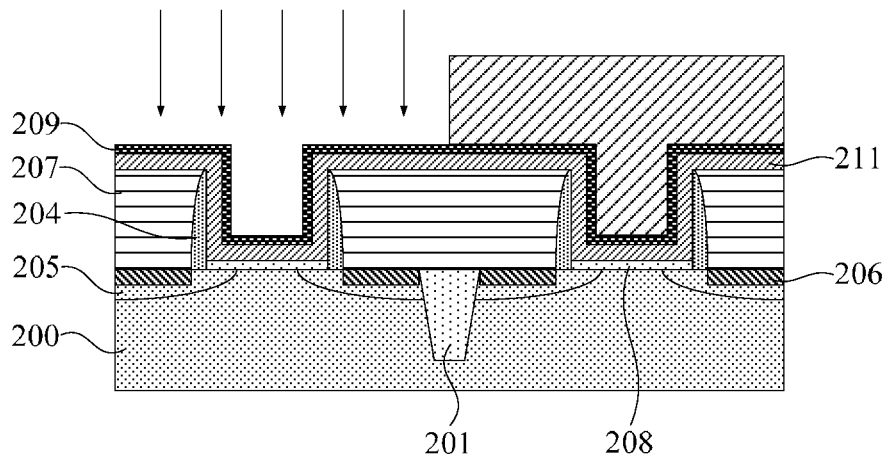
FIG. 14 is a schematic cross-sectional view after N-type dopant is implanted into a first metal gate in a method for forming a planar gate semiconductor device according to Embodiment 2 of the present disclosure.
Figure 15:
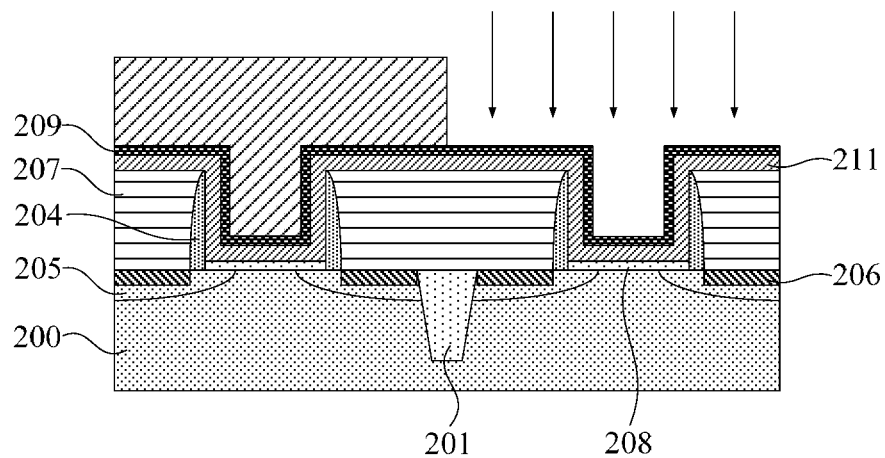
FIG. 15 is a schematic cross-sectional view after P-type dopant is implanted into a first metal gate in a method for forming a planar gate semiconductor device according to Embodiment 2 of the present disclosure.

Referring to FIG. 14 and FIG. 15, a first metal gate is formed and doped to adjust the work function of the transistor. In one embodiment, the first metal gate 209 is formed on the surface of the ferroelectric gate dielectric layer 211. And an N-type doping and a P-type doping are processed by an ion implantation into the first metal gate 209 within in the NMOSFET region and PMOSFET region respectively so as to adjust the work function of the NMOSFET and the PMOSFET respectively. Specifically, in FIG. 14, define the left exposed area as an N-type MOSFET region, and the N-type dopant is implanted into this region. The region shielded on the right side is defined as a PMOSFET region, in this region, no dopant is implanted. In FIG. 15, the left N-type region is shielded, and a P-type dopant is implanted to the right PMOSFET region. By doping different types of dopants for different regions in the first metal gate 209, P-type and/or N-type work function metal layer can be formed respectively. For the specific processes, refer to step 6) in Embodiment 1, and the details are not repeated here. In addition, referring to Embodiment 1, in other embodiments of the present disclosure, the first metal gate 209 within NMOSFET region and the first metal gate 209 within PMOSFET region may also be formed by a dual metal gate work function process for adjusting the work function of the transistor in the NMOSFET region and the PMOSFET region respectively. That is, a P-type work function metal material is directly deposited on the ferroelectric gate dielectric layer 211 within PMOSFET region through a P-type metal gate work function process, and used as the first metal gate 209 of the PMOSFET region; an N-type work function metal material is directly deposited on the ferroelectric gate dielectric layer 211 within the NMOSFET region through the N-type metal gate work function process, and used as the first metal gate 209 of the NMOSFET region.

Figure 16:
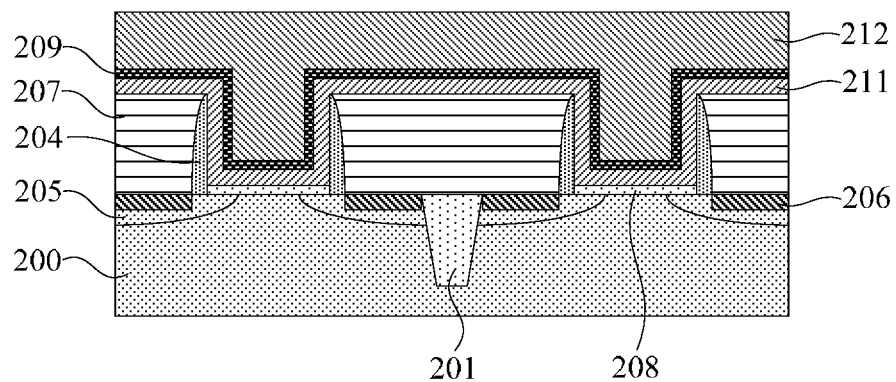
FIG. 16 is a schematic cross-sectional view after a second metal gate 212 is formed in a method for forming a planar gate semiconductor device according to Embodiment 2 of the present disclosure.
Figure 17:
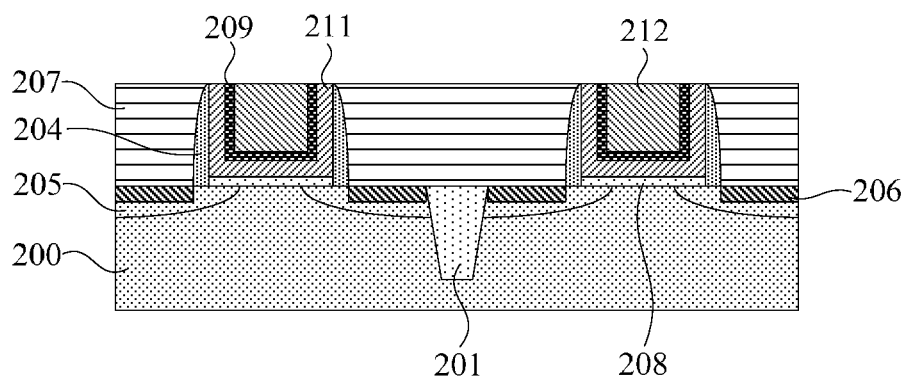
FIG. 17 is a schematic cross-sectional view after chemical mechanical polishing is performed on a second metal gate 212 in a method for forming a planar gate semiconductor device according to Embodiment 2 of the present disclosure.

In step 6), referring to FIG. 16 and FIG. 17, a second metal gate 212 is formed, and then polished to the interlayer dielectric layer 207 by CMP. For the composition and forming method of the second metal gate 212, please refer to step 6) in Embodiment 1, and the details are not repeated here.

After step 6), other existing integrated circuit processes such as forming a contact interconnection structure can be further performed.

The gate structure of the planar gate semiconductor device provided in this embodiment is formed by the method for forming a gate structure provided in the present disclosure. In order to eliminate the influence of the deposited work function metal layer on the formation of the ferroelectric-phase gate dielectric layer, the stress sacrificial layer of a material such as TiN is deposited on the ferroelectric gate dielectric layer, and an annealing process is performed to induce the formation of the ferroelectric phase in the ferroelectric gate dielectric layer. In this way, a ferroelectric-phase gate dielectric layer with an optimized strength is obtained, and also the band-edge work function and excellent leakage characteristics of the device are ensured.

It should be noted that the CMOSFET semiconductor device is formed in this embodiment, and therefore, the active region including the NMOSFET region and the PMOSFET region is formed on the semiconductor substrate 200. Subsequently, corresponding processes are performed on the NMOSFET region and the PMOSFET region simultaneously. In other embodiments of the present disclosure, the semiconductor device may be an NMOSFET device or a PMOSFET device. The forming process may refer to the process corresponding to the NMOSFET region or the PMOSFET region described in this embodiment respectively.

Embodiment 3

Referring to FIGS. 18 to 48, this embodiment provides a method for forming a fin gate semiconductor device (FINFET), including the following steps.

Figure 18:
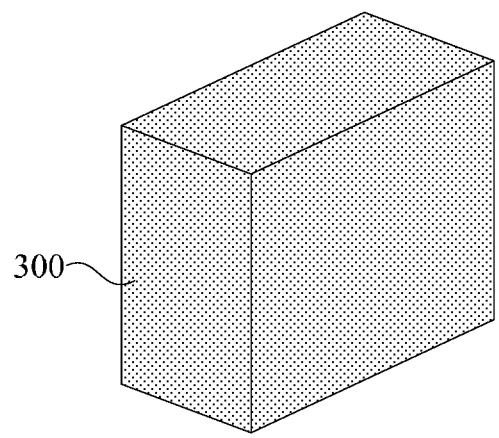
FIG. 18 is a schematic perspective view of a semiconductor substrate 300 in a method for forming a fin gate semiconductor device according to Embodiment 3 of the present disclosure.
Figure 19:
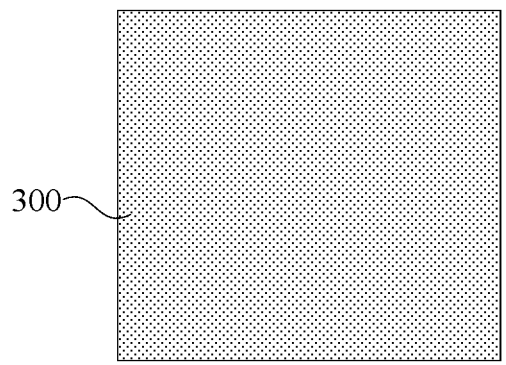
FIG. 19 is a schematic cross-sectional view of a semiconductor substrate 300 in a method for forming a fin gate semiconductor device according to Embodiment 3 of the present disclosure.
Figure 20:
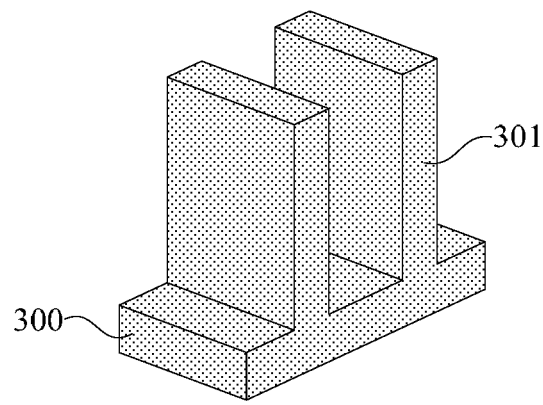
FIG. 20 is a schematic perspective view after a fin structure 301 is formed in a method for forming a fin gate semiconductor device according to Embodiment 3 of the present disclosure.
Figure 21:
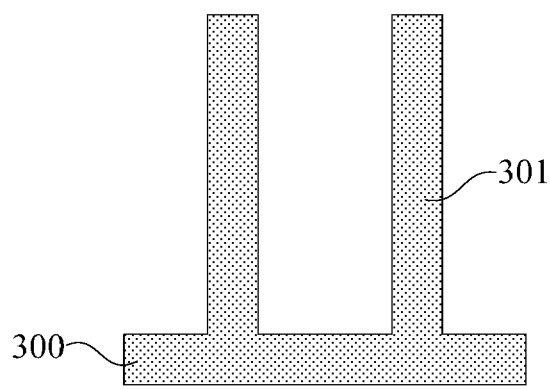
FIG. 21 is a schematic cross-sectional view after a fin structure 301 is formed in a method for forming a fin gate semiconductor device according to Embodiment 3 of the present disclosure.
Figure 22:
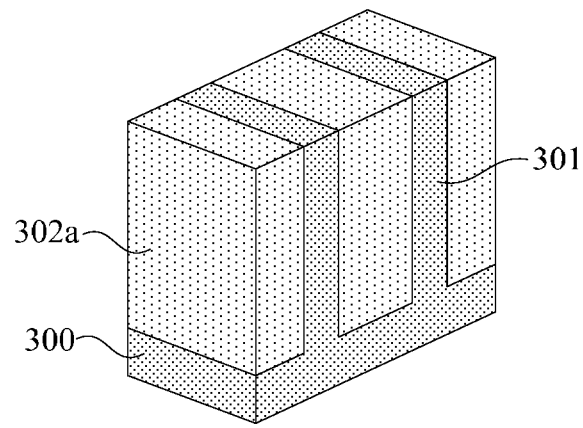
FIG. 22 is a schematic perspective view after an isolation material layer 302a is deposited in a method for forming a fin gate semiconductor device according to Embodiment 3 of the present disclosure.
Figure 23:
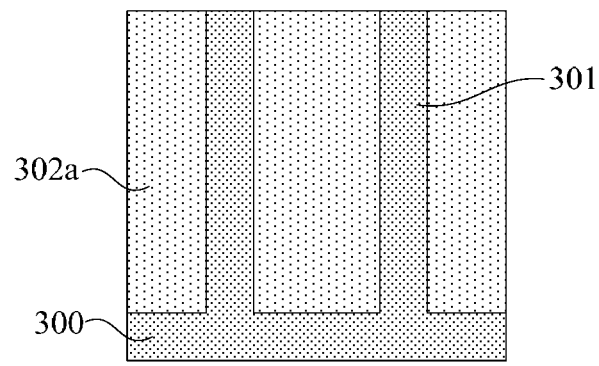
FIG. 23 is a schematic cross-sectional view after an isolation material layer 302a is deposited in a method for forming a fin gate semiconductor device according to Embodiment 3 of the present disclosure.
Figure 24:
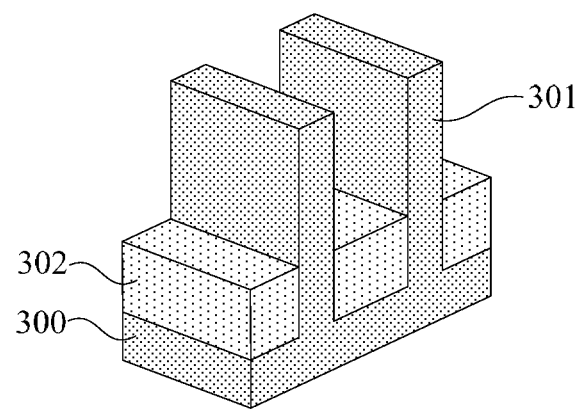
FIG. 24 is a schematic perspective view after an isolation structure 302 is formed in a method for forming a fin gate semiconductor device according to Embodiment 3 of the present disclosure.
Figure 25:
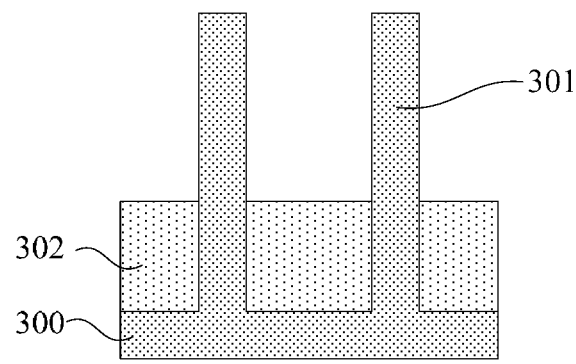
FIG. 25 is a schematic cross-sectional view after an isolation structure 302 is formed in a method for forming a fin gate semiconductor device according to Embodiment 3 of the present disclosure.
Figure 26:
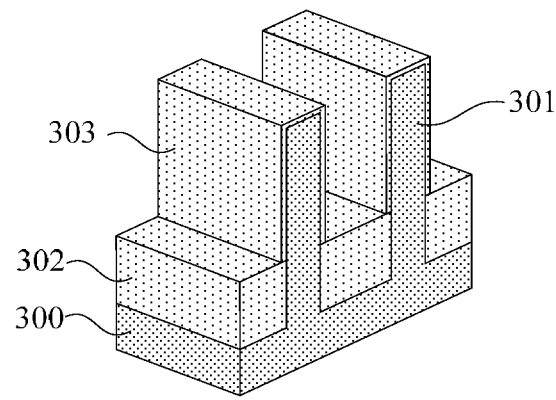
FIG. 26 is a schematic perspective view after a dummy gate oxide layer 303 is formed in a method for forming a fin gate semiconductor device according to Embodiment 3 of the present disclosure.
Figure 27:
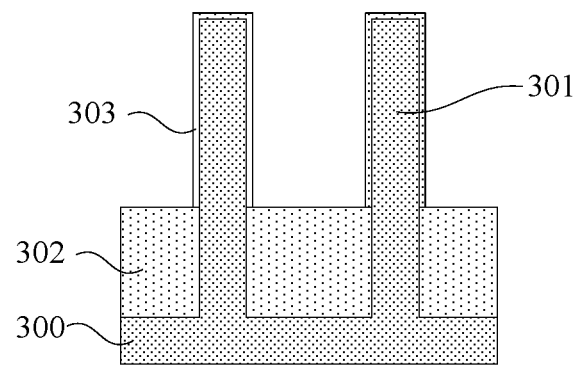
FIG. 27 is a schematic cross-sectional view after a dummy gate oxide layer 303 formed in a method for forming a fin gate semiconductor device according to Embodiment 3 of the present disclosure.

In step 1), referring to FIGS. 18 to 25, a semiconductor substrate 300 is provided. The semiconductor substrate 300 may be an SOI substrate. In addition, a fin structure 301 and an isolation structure 302 are formed. Specifically, the semiconductor substrate 300 is shown in FIG. 18 and FIG. 19. The semiconductor substrate 300 can be a silicon substrate or a silicon germanium substrate, or the like. In FIG. 20 and FIG. 21, a fin structure 301 is formed by photolithography and etching the semiconductor substrate 300. In FIG. 22 and FIG. 23, an isolation material layer 302a is deposited between the fin structures 301, and the isolation material layer 302a may be oxide dielectric material such as silicon dioxide. In FIG. 24 and FIG. 25, the isolation structure 302 is formed by etching back the isolation material layer 302a.

Figure 28:
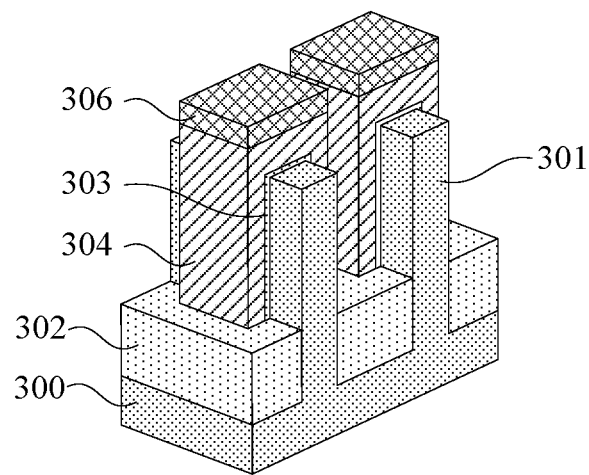
FIG. 28 is a schematic perspective view after a dummy gate amorphous silicon layer 304 is formed in a method for forming a fin gate semiconductor device according to Embodiment 3 of the present disclosure.
Figure 29:
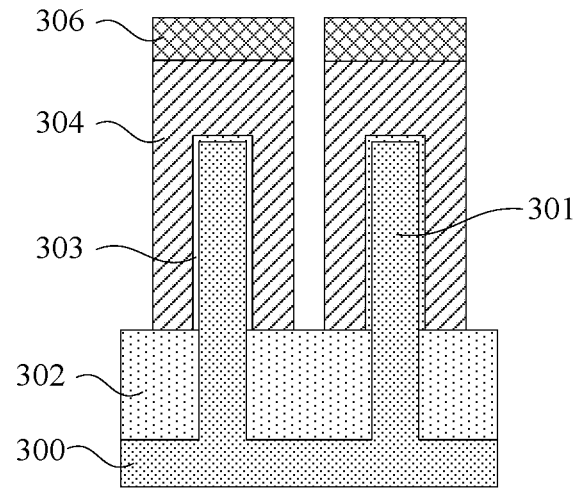
FIG. 29 is a schematic cross-sectional view along the transverse direction of the fin structure after the dummy gate amorphous silicon layer 304 is formed in a method for forming a fin gate semiconductor device according to Embodiment 3 of the present disclosure.
Figure 30:
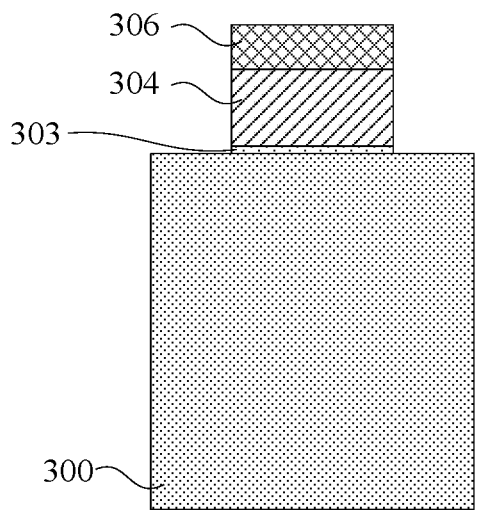
FIG. 30 is a schematic cross-sectional view along an extending direction of the fin structure after a dummy gate amorphous silicon 304 is formed in a method for forming a fin gate semiconductor device according to Embodiment 3 of the present disclosure.
Figure 31:
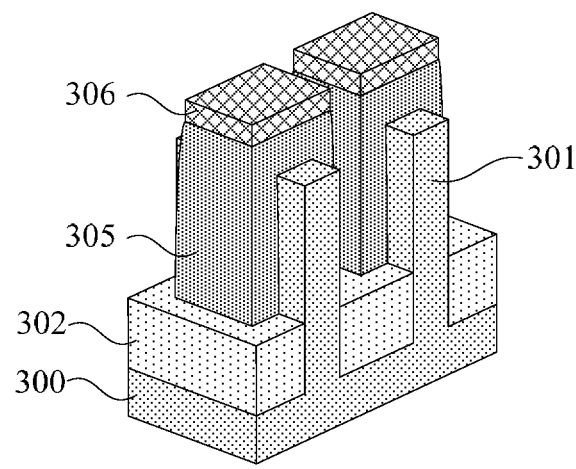
FIG. 31 is a schematic perspective view after a sidewall spacer 305 is formed in a method for forming a fin gate semiconductor device according to Embodiment 3 of the present disclosure.
Figure 32:
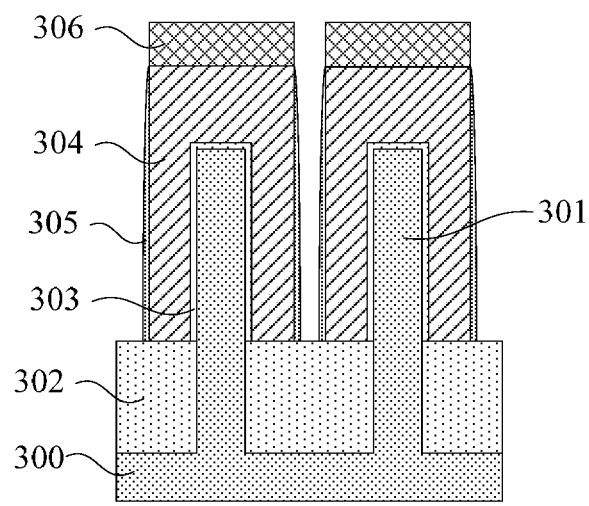
FIG. 32 is a schematic cross-sectional view along the transverse direction of a fin structure after a sidewall spacer 305 is formed in a method for forming a fin gate semiconductor device according to Embodiment 3 of the present disclosure.
Figure 33:
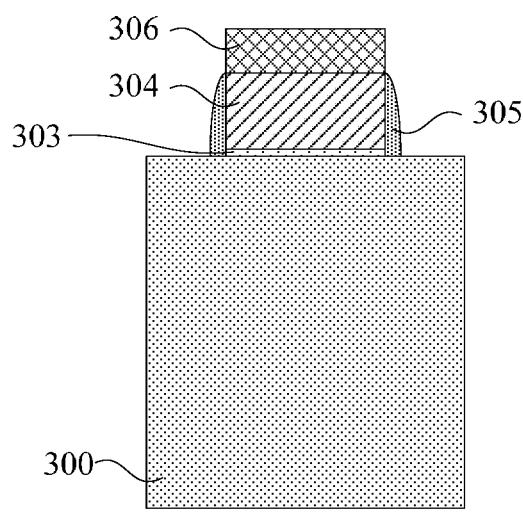
FIG. 33 is a schematic cross-sectional view along an extending direction of a fin structure after a sidewall spacer 305 is formed in a method for forming a fin gate semiconductor device according to Embodiment 3 of the present disclosure.
Figure 34:
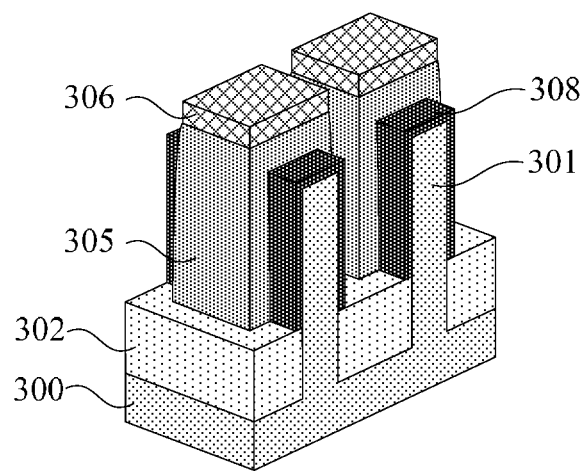
FIG. 34 is a schematic perspective view after a source and drain region 308 is formed in a method for forming a fin gate semiconductor device according to Embodiment 3 of the present disclosure.
Figure 35:
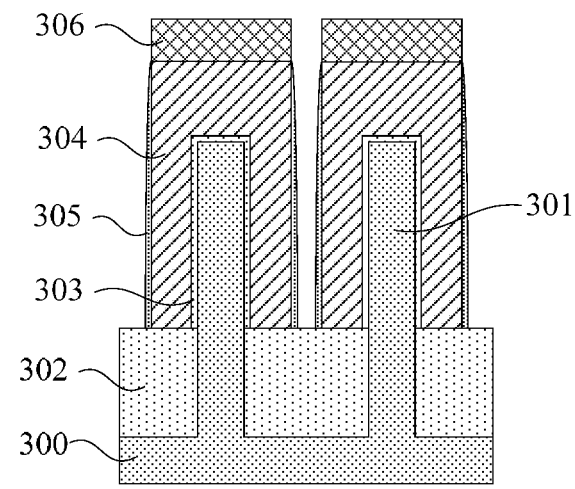
FIG. 35 is a schematic cross-sectional view along the transverse direction of a fin structure after a source and drain region 308 is formed in a method for forming a fin gate semiconductor device according to Embodiment 3 of the present disclosure.
Figure 36:
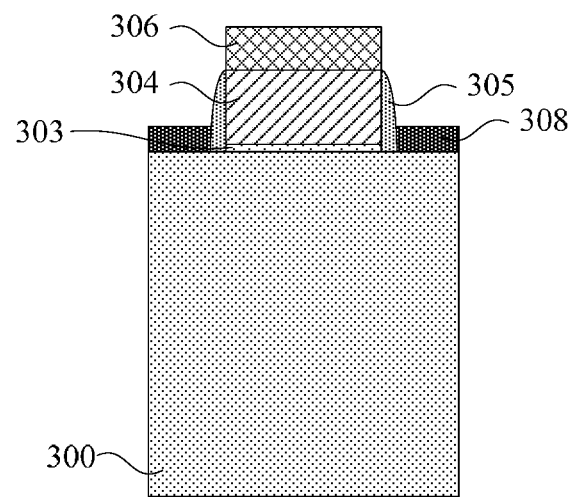
FIG. 36 is a schematic cross-sectional view along an extending direction of a fin structure after a source and drain region 308 is formed in a method for forming a fin gate semiconductor device according to Embodiment 3 of the present disclosure.

In step 2), referring to FIGS. 26 to 33, a dummy gate structure and a sidewall spacer 305 are formed on the fin structure 301. The dummy gate structure includes a dummy gate oxide layer 303 and a dummy gate amorphous silicon layer 304 formed sequentially. Specifically, in FIG. 26 and FIG. 27, the dummy gate oxide layer 303 is formed on the surface of the fin structure 301 through a thermal oxidation process. In FIGS. 28 to 30, the dummy gate amorphous silicon layer 304 is formed by depositing an amorphous silicon layer, and etched with a hard mask 306. In FIGS. 31 to 33, the sidewall spacer 305 is formed on the side wall of the dummy gate structure by depositing a sidewall spacer material layer and then etching back.

Figure 37:
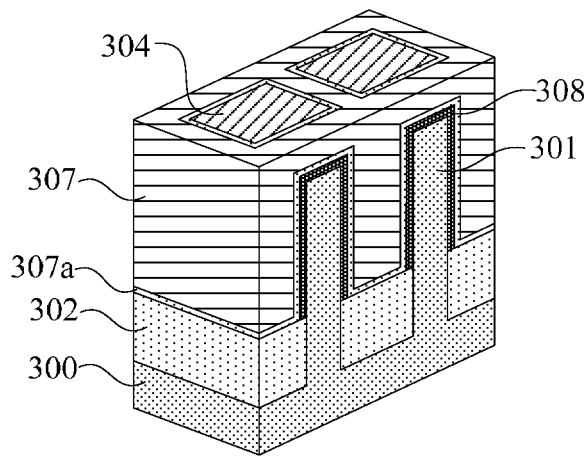
FIG. 37 is a schematic perspective view after an interlayer dielectric layer 307 is formed and CMP is performed in a method for forming a fin gate semiconductor device according to Embodiment 3 of the present disclosure.
Figure 38:
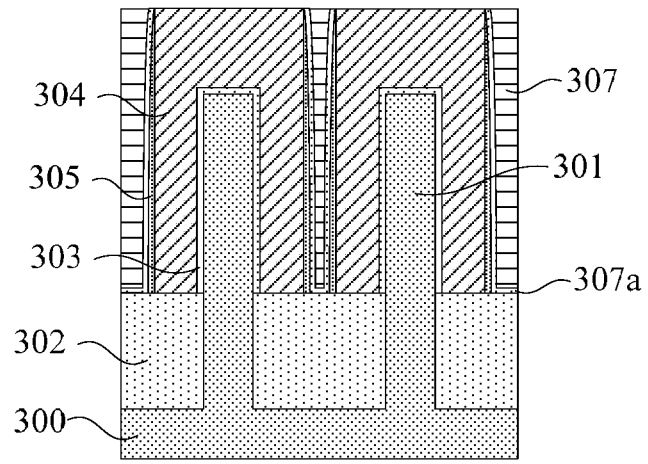
FIG. 38 is a schematic cross-sectional view along the transverse direction of a fin structure after an interlayer dielectric layer 307 is formed and CMP is performed in a method for forming a fin gate semiconductor device according to Embodiment 3 of the present disclosure.
Figure 39:
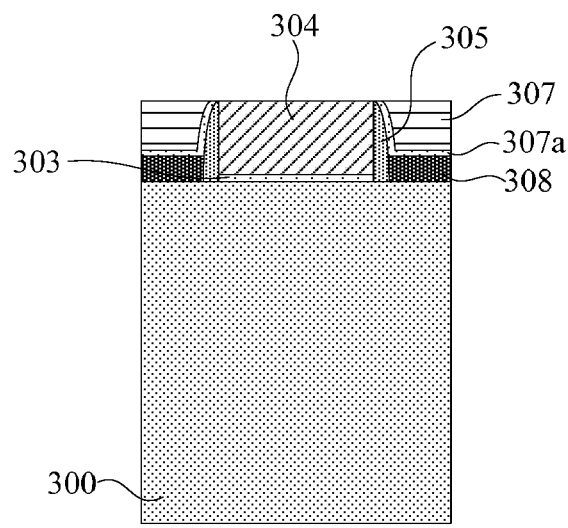
FIG. 39 is a schematic cross-sectional view along an extending direction of a fin structure after an interlayer dielectric layer 307 is formed and CMP is performed in a method for forming a fin gate semiconductor device according to Embodiment 3 of the present disclosure.

In step 3), referring to FIGS. 34 to 39, an interlayer dielectric layer 307 and a source/drain region 308 are formed. Specifically, in FIGS. 34 to 36, the source and drain regions 308 are formed by growing a P or N type source and drain epitaxial layer on the region of the fin structure 301 not covered by the dummy gate structure. In FIGS. 37 to 39, the interlayer dielectric layer 307 is deposited to cover the dummy gate structure and the fin structure 301. CMP the interlayer dielectric layer 307, and remove the hard mask 306 to expose the top of the dummy gate amorphous silicon layer 304. Optionally, an interlayer barrier layer 307a is deposited to serve as a contact etching barrier layer before depositing the interlayer dielectric layer 307.

Figure 40:
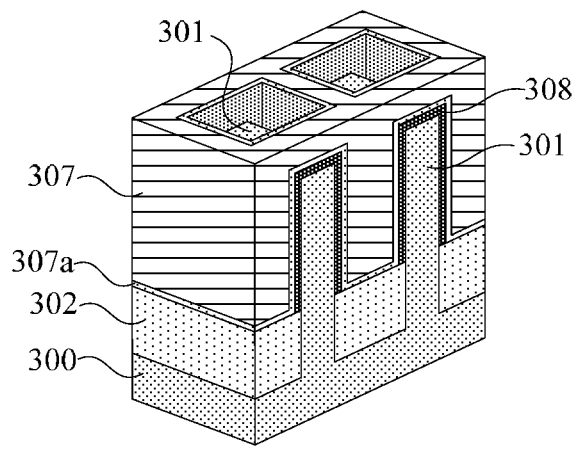
FIG. 40 is a schematic perspective view after a dummy gate stack is removed in a method for forming a fin gate semiconductor device according to Embodiment 3 of the present disclosure.
Figure 41:
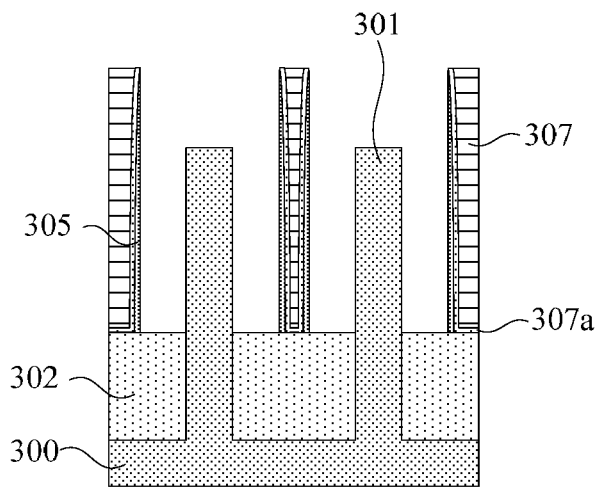
FIG. 41 is a schematic cross-sectional view along the transverse direction of a fin structure after a dummy gate stack is removed in a method for forming a fin gate semiconductor device according to Embodiment 3 of the present disclosure.
Figure 42:
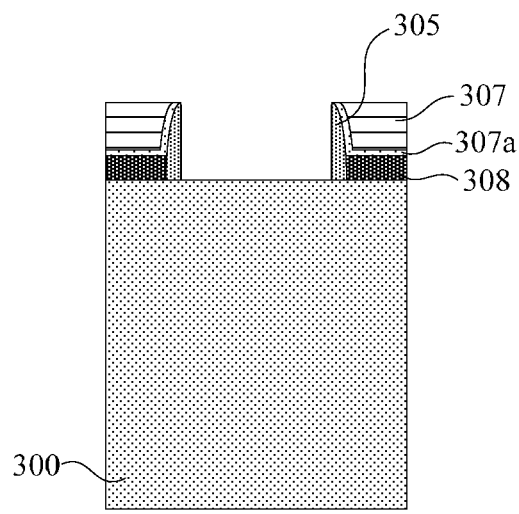
FIG. 42 is a schematic cross-sectional view along an extending direction of a fin structure after a dummy gate stack is removed in a method for forming a fin gate semiconductor device according to Embodiment 3 of the present disclosure.

In step 4), referring to FIGS. 40 to 42, the dummy gate stack is removed to expose the fin structure 301 of the semiconductor substrate.

Figure 43:
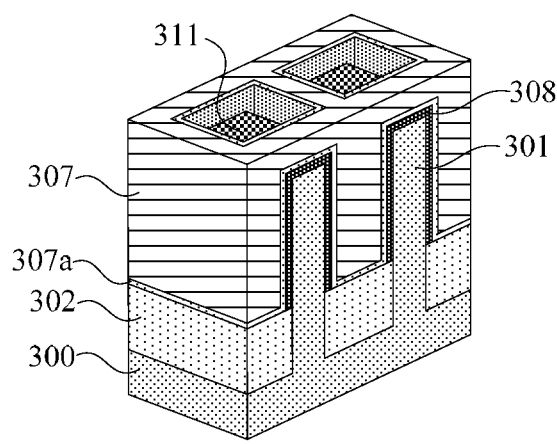
FIG. 43 is a schematic perspective view after an interface oxide layer 309, a ferroelectric gate dielectric layer 310 and a first metal gate 311 are formed in a method for forming a fin gate semiconductor device according to Embodiment 3 of the present disclosure.
Figure 44:
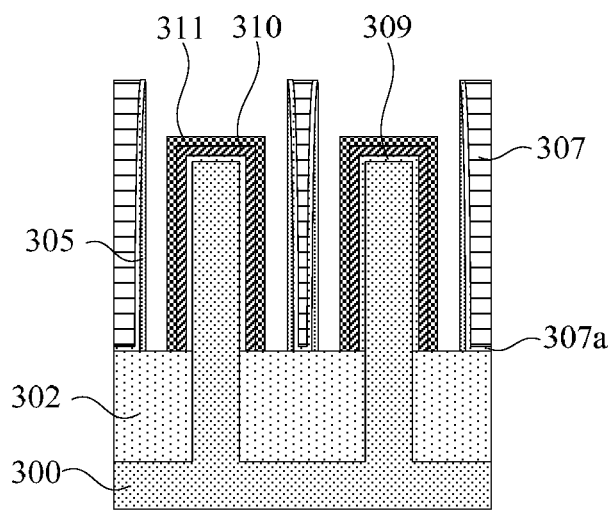
FIG. 44 is a schematic cross-sectional view along the transverse direction of a fin structure after an interface oxide layer 309, a ferroelectric gate dielectric layer 310 and a first metal gate 311 are formed in a method for forming a fin gate semiconductor device according to Embodiment 3 of the present disclosure.
Figure 45:
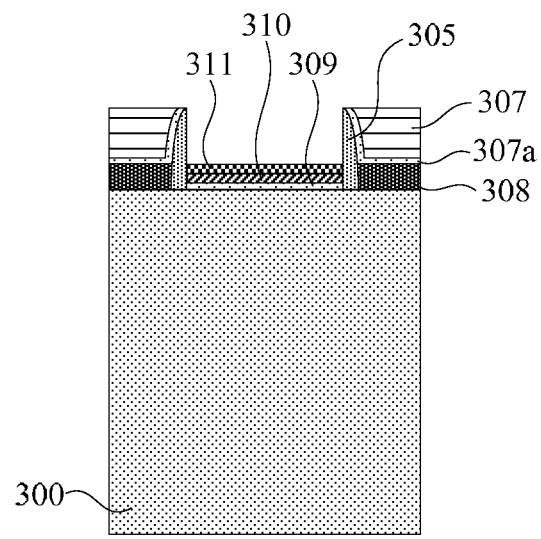
FIG. 45 is a schematic cross-sectional view along an extending direction of a fin structure after an interface oxide layer 309, a ferroelectric gate dielectric layer 310 and a first metal gate 311 are formed in a method for forming a fin gate semiconductor device according to Embodiment 3 of the present disclosure.

In step 5), referring to FIGS. 43 to 45, the interface oxide layer 309, the ferroelectric gate dielectric layer 310, and the first metal gate 311 described in step 5) of Embodiment 2 are formed on the semiconductor substrate. The ferroelectric gate dielectric layer 310 includes a high-K seed layer, a ferroelectric-phase gate dielectric layer, and an etching barrier metal layer. For specific structures and forming methods thereof, refer to Embodiment 1 and Embodiment 2, and the details are not repeated here. It should be noted that, according to the method for forming a gate structure provided in Embodiment 1, in the fin gate semiconductor device in this embodiment, the substrate includes a semiconductor substrate and a fin structure formed thereon. The dummy gate stack is formed on the fin structure. After the dummy gate stack is removed to form a gate opening, subsequent layers of structure are continuously formed on the fin structure in the gate opening.

Figure 46:
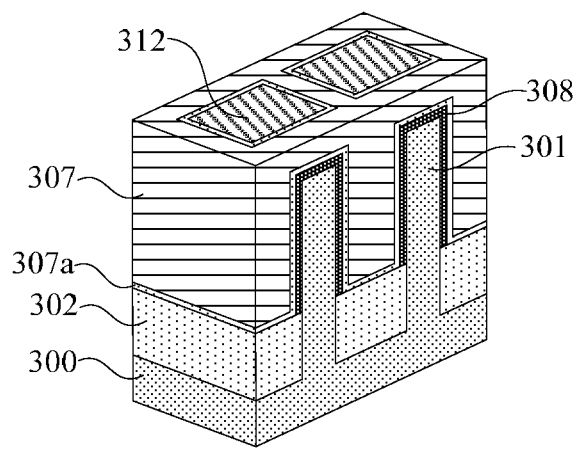
FIG. 46 is a schematic perspective view after a second metal gate 312 is formed in a method for forming a fin gate semiconductor device according to Embodiment 3 of the present disclosure.
Figure 47:
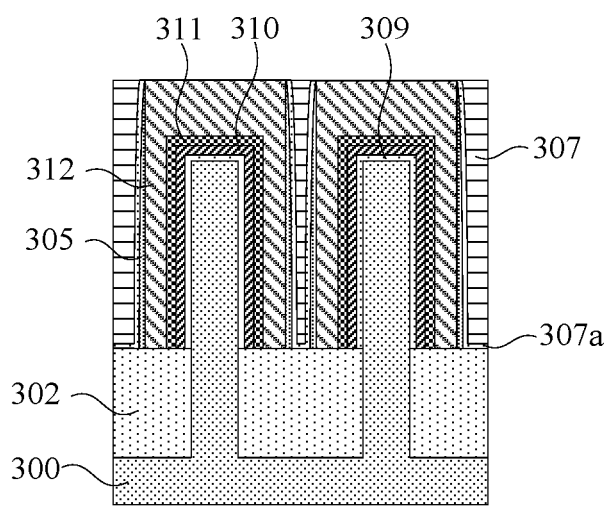
FIG. 47 is a schematic cross-sectional view along the transverse direction of a fin structure after a second metal gate 312 is formed in a method for forming a fin gate semiconductor device according to Embodiment 3 of the present disclosure.
Figure 48:
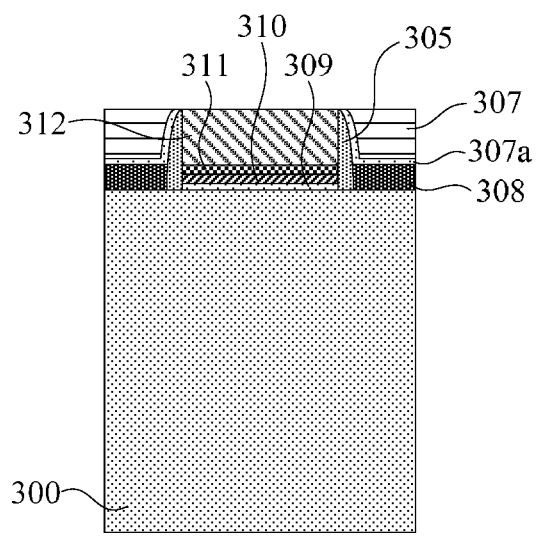
FIG. 48 is a schematic cross-sectional view along an extending direction of a fin structure after a second metal gate 312 is formed in a method for forming a fin gate semiconductor device according to Embodiment 3 of the present disclosure.

In step 6), referring to FIGS. 46 to 48, a second metal gate 312 is formed. The second metal gate 312 fills the space occupied by the dummy gate amorphous silicon layer 304. Optionally, the second metal gate 312 may be formed by depositing a metal material layer and performing CMP. The second metal gate 312 may be a multi-layer structure. For specific structures and the forming method, refer to Embodiment 1 and Embodiment 2, and the details are not repeated here.

After step 6), other existing integrated circuit process for forming a contact interconnection structure may be further performed.

The gate structure in fin gate semiconductor device provided in this embodiment is formed by the method for forming a gate structure of a device in the present disclosure. In order to eliminate the influence of the deposited work function metal on the formation of the ferroelectric-phase gate dielectric a stress sacrificial layer such as TiN is deposited on the ferroelectric gate dielectric layer, and an annealing process is performed to induce the formation of ferroelectric phase in the ferroelectric gate dielectric layer. In this way, a ferroelectric-phase gate with optimized strength is obtained, and also the dual band-edge work function required for the CMOS device and excellent leakage characteristics are ensured.

It should be noted that the semiconductor device formed in this embodiment may be an NMOSFET device, a PMOSFET device, or a CMOSFET device. The type of the formed device may be determined according to the fin structure 301 and the type of the P/N doping type in the source/drain region 308 formed thereon. For the specific process, please refer to the relevant description in Embodiment 1.

Embodiment 4

Referring to FIGS. 49 to 66, this embodiment provides a method for forming a gate-all-around (GAA) semiconductor device, including the following steps.

Figure 49:
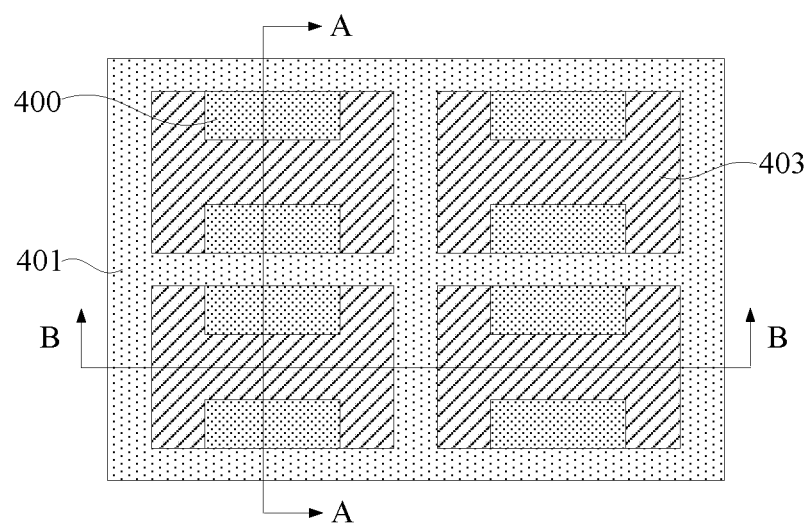
FIG. 49 is a schematic top view after a shallow trench isolation 401, a mask oxide layer 402, and a hard mask 403 are formed on a semiconductor substrate 400 in a method for forming a gate-all-around semiconductor device according to Embodiment 4 of the present disclosure.
Figure 50:
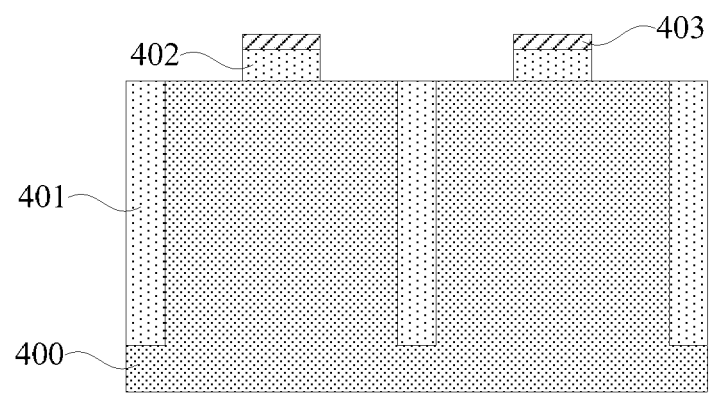
FIG. 50 is a schematic cross-sectional view along an AA direction shown in FIG. 49.
Figure 51:
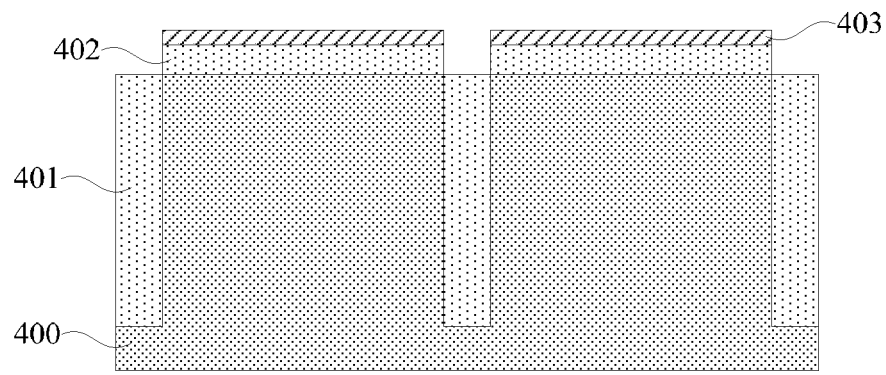
FIG. 51 is a schematic cross-sectional view along a BB direction shown in FIG. 49.

In step 1), referring to FIGS. 49 to 50, a semiconductor substrate 400 is prepared. In this embodiment, the semiconductor substrate 400 can be a silicon substrate or a silicon germanium substrate. The semiconductor substrate 400 may further include other substrates such as an SOI substrate. A shallow trench isolation 401 is formed on the semiconductor substrate 400. The shallow trench isolation 401 divides the semiconductor substrate 400 into an NMOSFET region and a PMOSFET region. A patterned oxide layer mask 402 and a hard mask 403 are also formed on the semiconductor substrate 400. The oxide layer mask 402 is a SiO$_2$ layer obtained by PECVD. The hard mask 403 is an amorphous silicon layer obtained by LPCVD. The above material layers are patterned by electron beam exposure and then dry etching, and a nanowire pattern is formed through reactive ion etching. In this embodiment, the oxide layer mask 402 and the hard mask 403 are used as nanowire etching masks to etch the underneath semiconductor substrate 400. In other embodiments of the present disclosure, the mask layer may be deposited by LPCVD, PECVD, ALD, MOCVD, PVD, or furnace thermal oxidation, or the like, patterned by optical exposure, electron beam exposure, nano-imprint, focused ion deposition, or the like, and then etched by plasma etching, reactive ion etching, ion beam etching, or the like, so as to form a patterned oxide layer mask 402 and a patterned hard mask 403 which are used as nanowire etching mask.

In step 2), referring to FIGS. 52 to 60, multiple of stacked nanowires within NMOS region and multiple of stacked nanowires within PMOS region are formed in the semiconductor substrate 400. In this embodiment, the semiconductor substrate 400 is etched through the nanowire etching mask formed in step 1), so as to form the multiple of stacked nanowires within NMOS region and the multiple of stacked nanowires within PMOS region. The multiple of stacked nanowires are further modified by an oxidation process and epitaxial growth.

Figure 52:
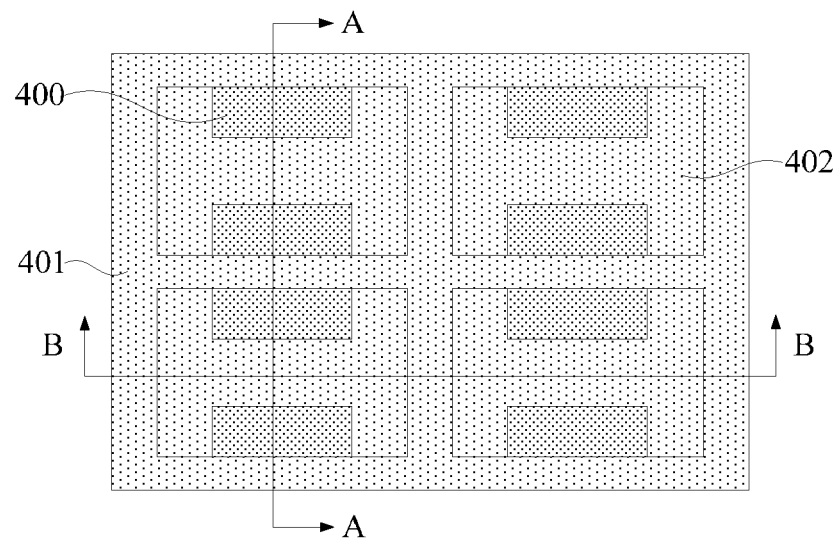
FIG. 52 is a top view after a first nanowires structure 404 is formed by dry etching in a method for forming a gate-all-around semiconductor device according to Embodiment 4 of the present disclosure.
Figure 53:
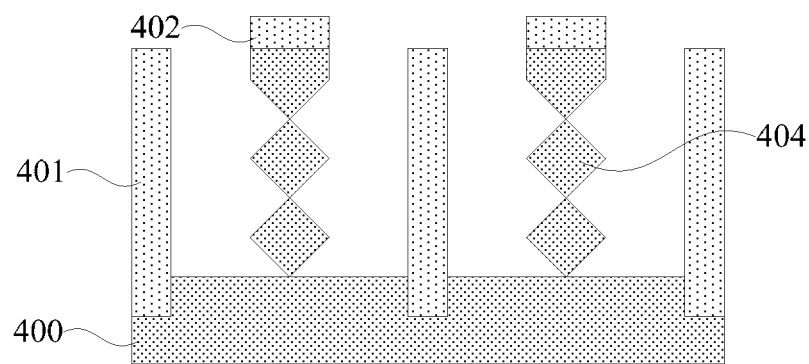
FIG. 53 is a schematic cross-sectional view along an AA direction shown in FIG. 52.
Figure 54:
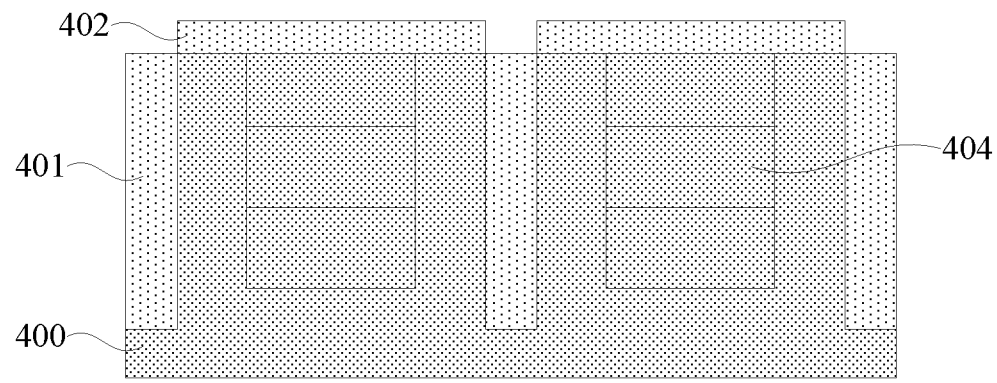
FIG. 54 is a schematic cross-sectional view along a BB direction shown in FIG. 52.

Specifically, in FIGS. 52 to 54, multiple of stacked nanowires within NMOS region and the multiple of stacked nanowires within PMOS region 404 are formed in the semiconductor substrate 400 through dry etching process. The dry etching process includes alternating anisotropic plasma etching and isotropic plasma etching. In the anisotropic etching process, only the trench bottom is etched, and the sidewall is not etched. In the isotropic etching process, both the trench bottom and the sidewall are etched. After the above alternating anisotropic etching and isotropic etching process are repeated, the multiple of stacked nanowires 404 are formed in the semiconductor substrate 400. The multiple of stacked nanowires 404 is made of silicon. Optionally, the etching gas used in the anisotropic plasma etching may be one or more of HBr or Cl2, aided by one or more of O2 or He. The etching power ranges from 150 W to 500 W. The etching gas used in the isotropic plasma etching may be SF$_6$, aided by He. The etching power ranges from 200 W to 800 W. For example, the anisotropic etching gas may be HBr, Cl$_2$, and O$_2$, the ratio of HBr:Cl$_2$ is between 1:1 and 1:5, O$_2$ is used as an additive. The isotropic etching gas may be SF$_6$ and He, the ratio of SF6:He is between 1:3 and 1:20. After each etching step, a silicon dioxide passivation layer can also be formed on the surface of the silicon by oxidation, so that the formed nanowires can be prevented from damaging in subsequent isotropic etching. In addition, the silicon dioxide passivation layer at the bottom region is opened by performing CF$_4$ anisotropic etching for the next step etching. In FIGS. 52 to 54, a total of three nanowires stacked up and down of the stacked nanowire structure 404 are formed. In other embodiments of the present disclosure, the stacking number of the stacked nanowire structures 404 can also be adjusted according to actual requirements, for example, may be single or more than three.

Figure 55:
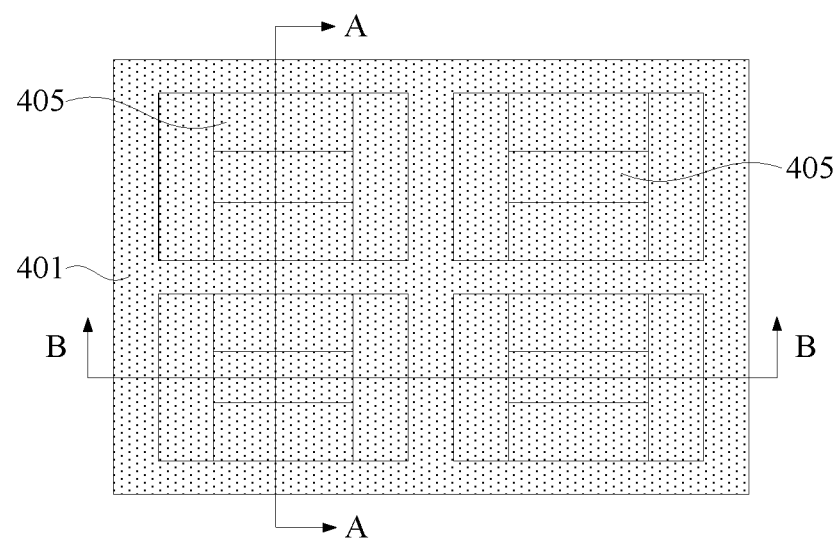
FIG. 55 is a top view after a sacrificial oxide layer 405 is formed by a thermal oxidation process in a method for forming a gate-all-around semiconductor device according to Embodiment 4 of the present disclosure.
Figure 56:
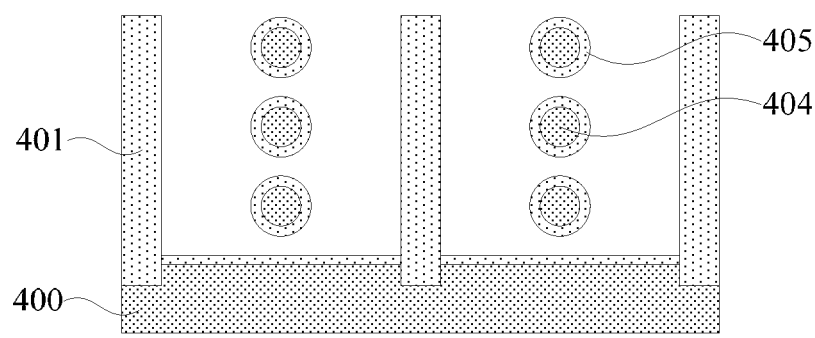
FIG. 56 is a schematic cross-sectional view along an AA direction shown in FIG. 55.
Figure 57:
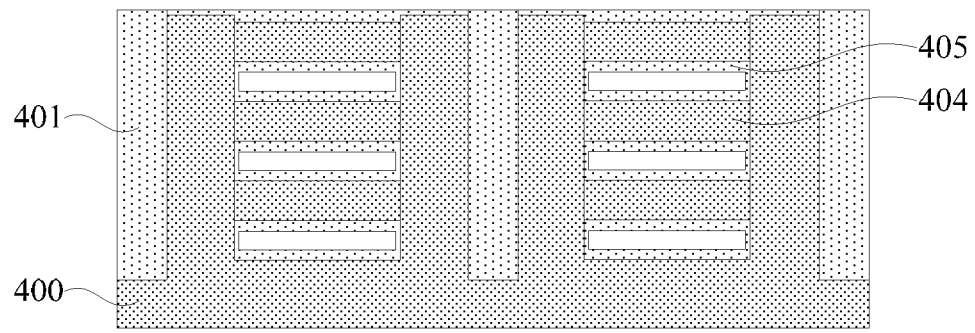
FIG. 57 is a schematic cross-sectional view along a BB direction shown in FIG. 55.

In FIGS. 55 to 57, after etching, the oxide layer mask 402 is removed. A sacrificial oxide layer 405 is formed on the surface of the multiple of stacked nanowires 404 through a thermal oxidation process, so as to control the size and shape of each nanowire. Comparing with the nanowires shown in FIG. 53 and FIG. 56, it can be seen that each nanowire turns into that with a circular cross-section after oxidation, which is due to the effect of stress-limited oxidation of nanowire materials during thermal oxidation. By controlling the thickness of the sacrificial oxide layer 405, the nanowire diameter of the first nanowires structure 404 can be further adjusted.

Figure 58:
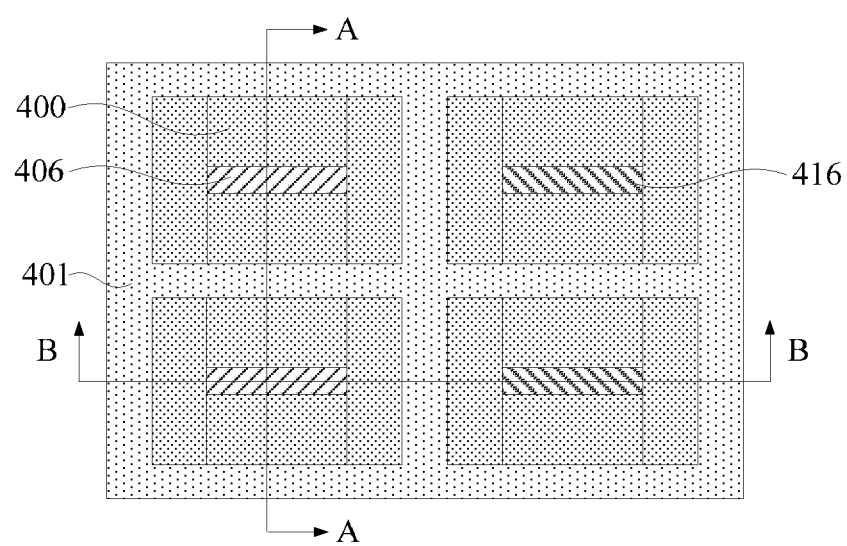
FIG. 58 is a top view after a sacrificial oxide layer is removed in a method for forming a gate-all-around semiconductor device according to Embodiment 4 of the present disclosure.
Figure 59:
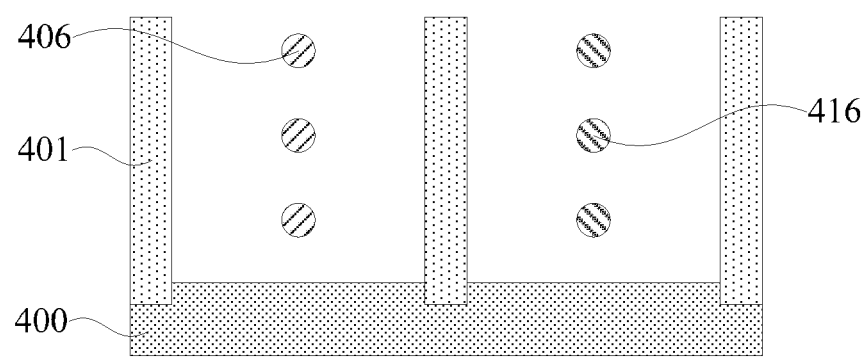
FIG. 59 is a schematic cross-sectional view along an AA direction shown in FIG. 58.
Figure 60:
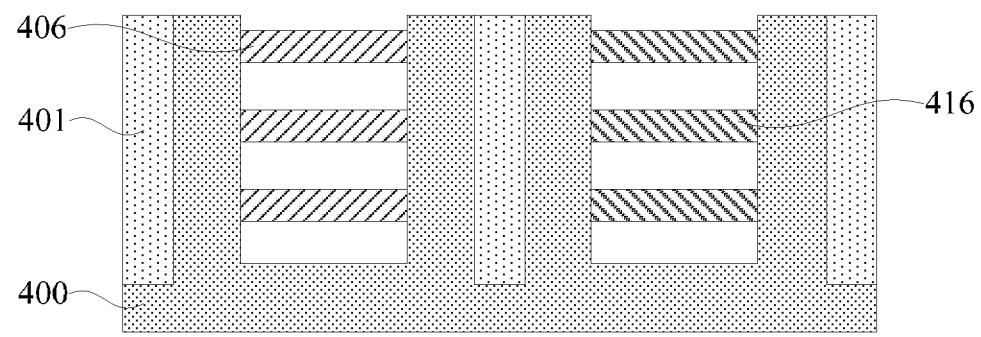
FIG. 60 is a schematic cross-sectional view along a BB direction shown in FIG. 58.

In FIGS. 58 to 60, the sacrificial oxide layer 405 is removed to release the nanowires, so as to obtain a first array of nanowires 406 within NMOS region and a second array of nanowires 416 within PMOS region. Depending on the substrate material, the nanowires included in the first array 406 are made of one of Si, III-V, II-VI, metal and metal silicide, and the nanowires included in the second array 416 are made of one of SiGe, Ge, Si, III-V, II-VI, metal and metal silicide.

When the semiconductor device is MOSFET, the nanowires 406 may be silicon, germanium, germanium silicon or other III-V semiconductors, II-VI semiconductors, metals or metal silicide. When the semiconductor device is a PMOSFET, the germanium silicon nanowire can greatly improve hole mobility and enhance device performance.

Optionally, when the multiple of stacked nanowires 404 within PMOSFET region is made of a silicon material, and the nanowires included in the second array 416 is germanium silicon nanowire, the process shown in FIGS. 55 to 60 further includes: selectively epitaxial growing germanium silicon on the second array of silicon nanowires 416, and depositing a silicon protective layer around the epitaxial germanium silicon layer, and then performing concentrated oxidation. After the oxide layer is removed, a second array of nanowires structure 416 having a germanium silicon nanowire is obtained. Specifically, the concentrated oxidation is performed at a temperature of 750° C. to 900° C., lasting for 8 to 15 hours. The thickness of the epitaxially grown germanium silicon layer ranges from 5 nm to 20 nm, and the thickness of the silicon protective film ranges from 0 nm and 3 nm. It should be noted that depositing the silicon protective film on the epitaxial germanium silicon layer is optional. That is, the concentrated oxidation may be performed directly based on the epitaxial germanium silicon layer, then the oxide layer is removed to obtain the second array of nanowires 416.

Figure 65:
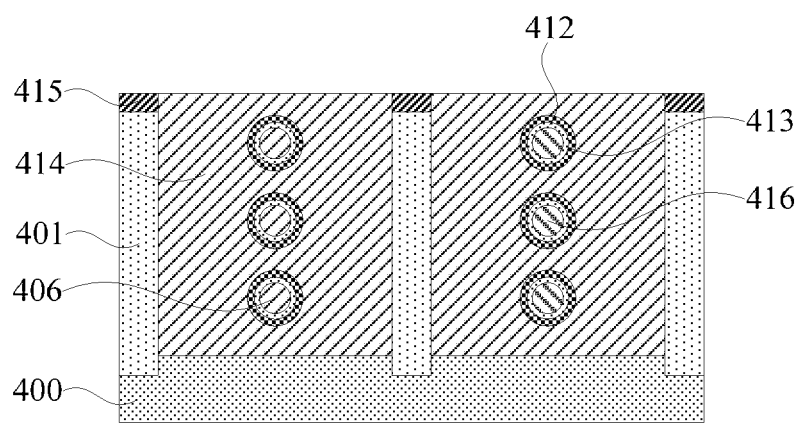
FIG. 65 is a schematic cross-sectional view along an AA direction shown in FIG. 64.

For example, when the transistor is a CMOSFET, referring to FIG. 65, an NMOSFET is on the left side, and a PMOSFET is on the right side. Therefore, the first array of nanowires 406 within the NMOSFET region may be made of a silicon material, and the second array of nanowires 416 within the PMOSFET region may be made of germanium silicon.

Figure 61:
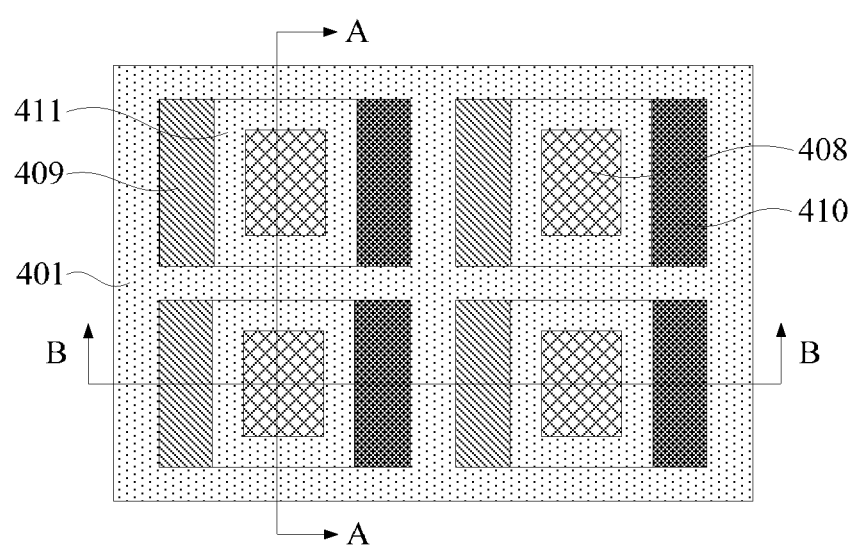
FIG. 61 is a top view after a dummy gate stack, a sidewall spacer 411, and a source region 409, and drain region 410 are formed in a method for forming a gate-all-around semiconductor device according to Embodiment 4 of the present disclosure.
Figure 62:
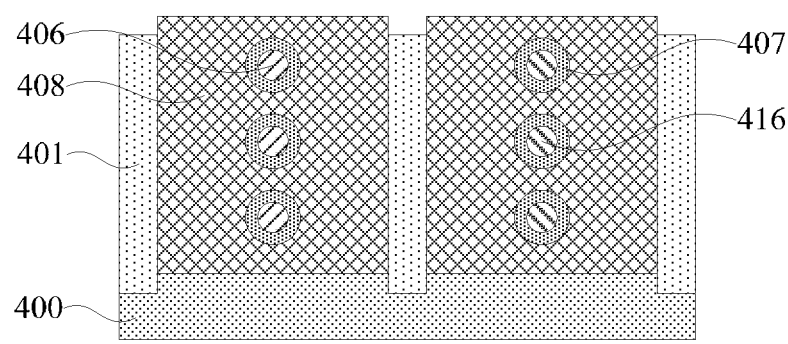
FIG. 62 is a schematic cross-sectional view along an AA direction shown in FIG. 61.
Figure 63:
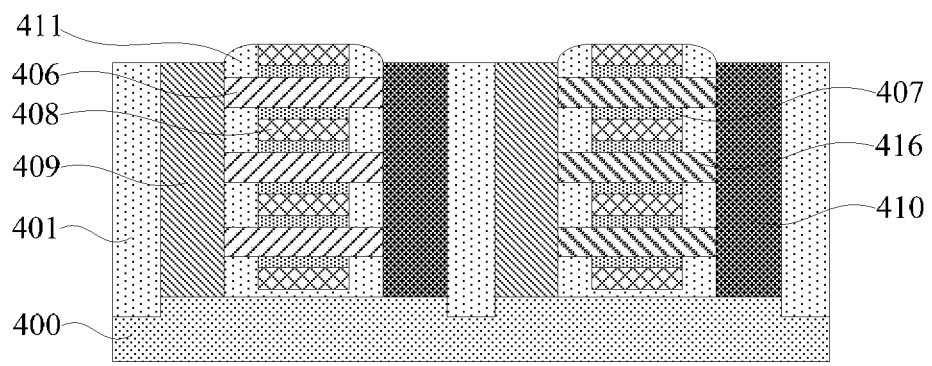
FIG. 63 is a schematic cross-sectional view along a BB direction shown in FIG. 61.

In step 3), referring to FIGS. 61 to 63, a dummy gate stack, a sidewall spacer 411, and a source/drain region are formed. The dummy gate stack includes a dummy gate oxide layer 407 and a dummy gate amorphous silicon layer 408. The dummy gate oxide layer 407 includes such as $SiO_2$, and the dummy gate amorphous silicon layer 408 includes such as polysilicon or α-Si. The source/drain region includes a source region 409 and a drain region 410, and the doping type is P+ for PMOSFET or N+ for NMOSFET. The dummy gate stack is surrounded by the sidewall spacer 411 and isolated from the source/drain region. Optionally, forming the source region 409 and the drain region 410 includes: forming a trench in the position for source/drain region on the semiconductor substrate 400 by dry etching after the dummy gate stack and the sidewall spacer 411 are formed, and filling the trench with a P+ or N+ epitaxial material to form the source region 409 and the drain region 410. For example, when the second array of nanowires 416 is made of germanium silicon material, the filling material forming the source region 409 and the drain region 410 is a P+ selective silicon germanium epitaxial layer doped with a B dopant. Due to a horizontal stress generated by the P+ germanium silicon source/drain region on the channel, the hole mobility of the PMOSFET device will be further improved. Optionally, a metal silicide layer may be formed on the surface of the source/drain region.

Figure 64:
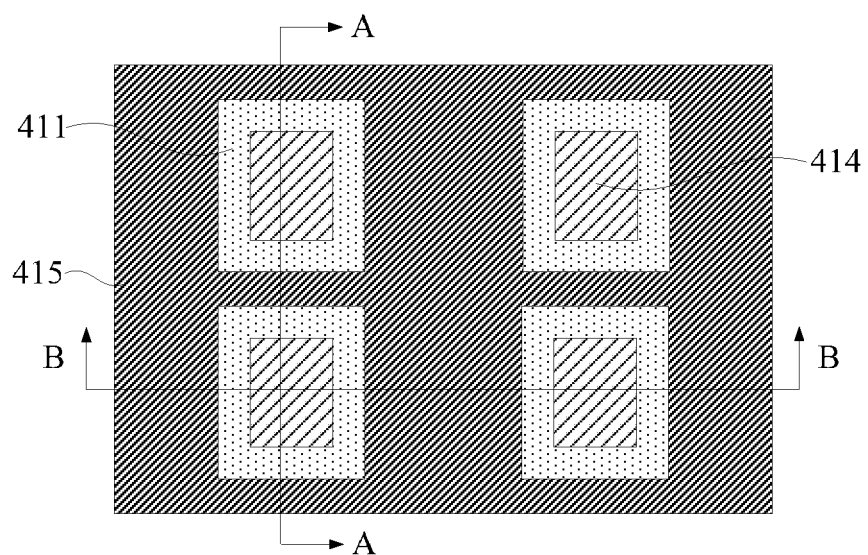
FIG. 64 is a schematic plan view after a ferroelectric gate dielectric layer 412, a first metal gate 413, a second metal gate 414, and an interlayer dielectric layer 415 are formed in a method for forming a gate-all-around semiconductor device according to Embodiment 4 of the present disclosure.

In step 4), referring to FIGS. 64 to 66, the dummy gate stack is removed to expose each of nanowires within the first array and the second array, and then a ferroelectric gate dielectric layer 412, a first metal gate 413, and a second metal gate 414 are formed sequentially around each of the nanowires within the first array and the second array thereon. It should be noted that the ferroelectric gate dielectric layer 412 includes an ultra-thin interfacial oxide layer (not shown), a high-K seed layer (optional, not shown), a ferroelectric gate dielectric layer/ferroelectric-phase gate dielectric layer, and an etching barrier metal layer (not shown) sequentially. For the composition of the above layers and the forming process, please refer to Embodiments 1 to 3, and the details are not repeated here. After the above structures are formed, an interlayer dielectric layer 415 is deposited, and other existing integrated circuit processes such as forming a contact interconnection structure may be further performed. In FIG. 65, the upper surface of the interlayer dielectric layer 415 is leveled with the upper surface of the second metal gate 414. In other embodiments of the present disclosure, the interlayer dielectric layer 415 may completely cover other structures, and the gate/source/drain is led out through a metal interconnection structure in the subsequent process. It should be noted that, corresponding to the method for forming a gate structure provided in Embodiment 1, in the gate-all-around semiconductor device in this embodiment, the substrate includes a semiconductor substrate and a nanowire structure formed on the semiconductor substrate. The dummy gate stack is formed on the first and second array of nanowires. After the dummy gate stack is removed, a gate stack structure is further formed on the nanowires within the first array and second array in the gate opening.

The gate-all-around semiconductor device provided in this embodiment forms a gate structure by using the method for forming a gate structure of a device provided in the present disclosure. In order to eliminate the influence of the deposited work function metal to the formation of the ferroelectric-phase in the ferroelectric gate dielectric layer, a stress sacrificial layer of a material such as TiN is deposited on the ferroelectric gate dielectric layer, and an annealing process is performed to induce the formation of the ferroelectric phase in the ferroelectric gate dielectric layer. In this way, a ferroelectric-phase gate with an optimized strength is obtained, while also ensuring the band-edge work function required for the MOS device and excellent leakage characteristics.

It should be noted that the CMOSFET semiconductor device is formed in this embodiment, and therefore, the active region including the NMOSFET region and the PMOSFET region is formed on the semiconductor substrate 400. Subsequently, corresponding processes are performed on the NMOSFET region and the PMOSFET region simultaneously. In other embodiments of the present disclosure, the semiconductor device may be an NMOSFET device or a PMOSFET device. The forming process may refer the process corresponding to the NMOSFET region or the PMOSFET region described in this embodiment, respectively.

In conclusion, the present disclosure provides a semiconductor device and a method for forming a gate structure thereof. The method for forming a gate structure of the semiconductor device includes: preparing a semiconductor substrate, and forming an active region on the semiconductor substrate, the active region includes an NMOSFET region and/or a PMOSFET region; forming a dummy gate stack, a gate sidewall spacer, N-type and/or P-type source/ drain regions, and an interlayer dielectric layer on the active region sequentially; removing the dummy gate stack to form a gate opening, and forming an interface oxide layer and a ferroelectric gate dielectric layer sequentially at the gate opening; forming a stress sacrificial layer on the ferroelectric gate dielectric layer, and performing an annealing process; during the annealing process, a clamping effect of the stress sacrificial layer, such as TiN film, induces the ferroelectric gate dielectric layer converted to form a ferroelectric-phase gate dielectric layer; removing the stress sacrificial layer; and forming a metal gate on the ferroelectric-phase gate dielectric layer.

In order to eliminate the influence of the deposited work function metal to the formation of the ferroelectric-phase gate dielectric layer, a stress sacrificial layer is deposited on the ferroelectric dielectric layer, and an annealing process is performed to induce the formation of the ferroelectric phase in the ferroelectric gate dielectric layer, then removing the stress sacrificial layer; and a work function metal layer is deposited. The present disclosure induces the formation of the negative capacitance effect, obtains the band-edge work function required by the MOS device, and prevents the gate leakage current density of an ultra-thin ferroelectric gate dielectric layer from being high.

The method for forming a gate structure of the device is applicable to various advanced nano-semiconductor devices, including planar gate semiconductor devices, fin gate semiconductor devices, gate-all-around semiconductor devices, and the like. The semiconductor device using the negative capacitance effect of ferroelectric material has a higher on/off current ratio. It provides a new way for ultra-high speed, low power consumption, high performance logic circuits and memory applications.

The above embodiments merely exemplify the principles and effects of the present disclosure, but are not intended to limit the present disclosure. A person skilled in the art can modify or change the above embodiments without departing from the spirit and scope of the present disclosure. Therefore, all equivalent modifications or changes made by those of ordinary skill in the art without departing from the spirit and technical concepts disclosed by the present disclosure should fall within the scope of the claims of the present disclosure.

What is claimed is:

1. A method for forming a gate structure of a semiconductor device, comprising:
preparing a semiconductor substrate, and forming an active region on the semiconductor substrate, wherein the active region comprises an NMOSFET region and/or a PMOSFET region;
forming a dummy gate stack, a gate sidewall spacer, NMOSFET source/drain region and/or PMOSFET source/drain region, and an interlayer dielectric layer on the active region sequentially;
removing the dummy gate stack to form a gate opening, and forming an interface oxide layer and a ferroelectric gate dielectric layer sequentially at the gate opening;
forming a stress sacrificial layer on the ferroelectric gate dielectric layer, and performing an annealing process; during the annealing process, the clamping effect of the stress sacrificial layer induces the ferroelectric gate dielectric layer converted to form a ferroelectric-phase gate dielectric layer;
removing the stress sacrificial layer; and
forming a metal gate on the ferroelectric-phase gate dielectric layer.

2. The method for forming a gate structure of a semiconductor device as in claim 1, before forming the ferroelectric gate dielectric layer on the semiconductor substrate, the method further comprises forming a high-K seed layer on the interface oxide layer, wherein the high-K seed layer is used to increase the strength of the ferroelectric phase in the ferroelectric-phase gate dielectric layer formed during the annealing process, and to reduce the gate leakage current density.

3. The method for forming a gate structure of a semiconductor device as in claim 2, wherein the high-K seed layer comprises one or more of $ZrO_2$ or $TiO_2$; and a thickness of the high-K seed layer ranges from 0.5 nm to 2.5 nm.

4. The method for forming a gate structure of a semiconductor device as in claim 1, wherein the interface oxide layer comprises one or more of $SiO_2$, SiON, $HfO_2$, $Al_2O_3$, HfSiO, HfSiON, HfAlON, $Y_2O_3$, $La_2O_3$, or HfLaON, and the thickness of the interfacial oxide layer ranges from 0.5 nm to 1.5 nm.

5. The method for forming a gate structure of a semiconductor device as in claim 1, before forming the stress sacrificial layer on the ferroelectric gate dielectric layer, the method further comprises forming an etching barrier metal layer on the ferroelectric gate dielectric layer; wherein when removing the stress sacrificial layer, an etching process is used to remove the stress sacrificial layer, and the etching is stopped on the etching barrier metal layer.

6. The method for forming a gate structure of a semiconductor device as in claim 5, wherein the etching barrier metal layer comprises one or more of TaN, Ta, MoN, or WN; and the thickness of the etching barrier metal layer ranges from 1.0 nm to 2.0 nm.

7. The method for forming a gate structure of a semiconductor device as in claim 5, wherein the etching process includes dry etching and wet etching.

8. The method for forming a gate structure of a semiconductor device as in claim 1, wherein the stress sacrificial layer includes TiN, and the thickness of the stress sacrificial layer ranges from 3 nm to 10 nm.

9. The method for forming a gate structure of a semiconductor device as in claim 1, wherein the annealing process comprises a rapid thermal annealing process, the annealing temperature ranges from 350° C. to 850° C., and the annealing time ranges from 20 seconds to 40 seconds.

10. The method for forming a gate structure of a semiconductor device as in claim 1, wherein the ferroelectric gate dielectric layer comprises one or more of HfZrO, HfZrAlO, HfAlO, HfSiO, HfLaO, HfSrO, HfGdO, and HfYO, and the thickness of the ferroelectric gate dielectric layer ranges from 1.2 nm to 10 nm.

11. The method for forming a gate structure of a semiconductor device as in claim 10, wherein a percentage content of doping element Zr in the HfZrO or the HfZrAlO ranges from 30% to 60%, a percentage content of doping element Si in the HfSiO ranges from 3% to 6%, a percentage content of doping element Y in the HfYO ranges from 4% to 6.5%, a percentage content of doping element Al in the HfZrAlO or the HfAlO ranges from 3.5% to 6.5%, a percentage content of doping element Gd in the HfGdO ranges from 1.5% to 5%, a percentage content of doping element Sr in the HfSrO ranges from 8% to 12%, and a percentage content of doping element La in the HfLaO ranges from 3% to 6%.

12. The method for forming a gate structure of a semiconductor device as in claim 1, wherein the metal gate comprises a first metal gate and a second metal gate sequentially formed on the ferroelectric-phase gate dielectric layer, and the thickness of the first metal gate ranges from 1 nm to 10 nm.

13. The method for forming a gate structure of a semiconductor device as in claim 12, after forming the first metal gate, the method further comprises doping a P-type dopant for PMOSFET and/or an N-type dopant for NMOSFET in the first metal gate.

14. The method for forming a gate structure of a semiconductor device as in claim 12, wherein the first metal gate comprises a P-type work function metal gate for PMOSFET and/or an N-type work function metal gate for NMOSFET formed by a dual metal gate work function process.

15. The method for forming a gate structure of a semiconductor device as in claim 12, wherein the second metal gate comprises an oxygen-absorbing metal layer, a barrier layer, and a filling metal layer formed sequentially; the oxygen-absorbing metal layer can be one or more of Ti, TiAl, or Ta; the barrier layer can be one or more of TiN, TaN, Ta, MoN, AlN, or WN; and the filling metal layer can be one or more of W, Al, TiAl, TiAlC, or Mo.

16. The method for forming a gate structure of a semiconductor device as in claim 1, after forming the metal gate, the method further comprises forming a contact interconnection structure and performing alloy annealing process.

17. The method for forming a gate structure of a semiconductor device as in claim 16, wherein the alloy annealing process is performed in an inert atmosphere or a weakly reducing atmosphere, and the annealing temperature ranges from 350° C. to 450° C.

18. A method for forming a semiconductor device, wherein a gate structure of the semiconductor device is formed by a method comprising:
preparing a semiconductor substrate, and forming an active region on the semiconductor substrate, wherein the active region comprises an NMOSFET region and/or a PMOSFET region;
forming a dummy gate stack, a gate sidewall spacer, N-type and/or P-type source/drain regions, and an interlayer dielectric layer on the active region sequentially;
removing the dummy gate stack to form a gate opening, and forming an interface oxide layer and a ferroelectric gate dielectric layer sequentially at the gate opening;
forming a stress sacrificial layer on the ferroelectric gate dielectric layer, and performing an annealing process; wherein during the annealing process, the clamping effect of the stress sacrificial layer induces the ferroelectric gate dielectric layer converted to form a ferroelectric-phase gate dielectric layer; removing the stress sacrificial layer; and
forming a metal gate on the ferroelectric-phase gate dielectric layer.

19. The method for forming a semiconductor device as in claim 18, wherein the semiconductor device comprises a planar gate semiconductor device, a fin gate semiconductor device, and a gate-all-around semiconductor device.

* * * * *